US012676288B2

(12) United States Patent
Park et al.

(10) Patent No.: US 12,676,288 B2
(45) Date of Patent: Jul. 7, 2026

(54) SUBSTRATE ANALYSIS SYSTEM

(71) Applicant: SAMSUNG ELECTRONICS CO., LTD., Suwon-si (KR)

(72) Inventors: Jonghyeok Park, Suwon-si (KR); Kwangrak Kim, Suwon-si (KR); Jiwoong Kim, Suwon-si (KR); Hyenok Park, Suwon-si (KR); Jeonghyeon Wang, Suwon-si (KR); Myungjun Lee, Suwon-si (KR); Yunje Cho, Suwon-si (KR); Junghee Cho, Suwon-si (KR); Yun Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 451 days.

(21) Appl. No.: 18/196,499

(22) Filed: May 12, 2023

(65) Prior Publication Data

US 2024/0112881 A1 Apr. 4, 2024

(30) Foreign Application Priority Data

Sep. 30, 2022 (KR) ......................... 10-2022-0125018

(51) Int. Cl.
H01J 37/28 (2006.01)
G01B 11/22 (2006.01)
(Continued)

(52) U.S. Cl.
CPC .............. H01J 37/28 (2013.01); G01B 11/22 (2013.01); H01J 37/20 (2013.01); H01J 37/304 (2013.01);
(Continued)

(58) Field of Classification Search
CPC .. H01J 37/00; H01J 37/02; H01J 37/26; H01J 37/28; H01J 37/3056; H01J 37/305; H01J 37/304; H01J 37/20; H01J 37/1472; H01J 2237/31749; H01J 2237/3174; H01J 2237/30483; H01J 2237/30466; H01J 2237/28; H01J 2237/2611; H01J 2237/24578; H01J 2237/204; H01J 2237/20214; H01J 2237/049; H01L 22/20;
(Continued)

(56) References Cited

U.S. PATENT DOCUMENTS

| | | | |
|---|---|---|---|
| 7,709,792 | B2 | 5/2010 | Naser-Ghodsi et al. |
| 8,178,838 | B2 | 5/2012 | Principe |
| 8,841,613 | B2 | 9/2014 | Zewail et al. |
| 9,412,559 | B2 | 8/2016 | Tanner et al. |

(Continued)

*Primary Examiner* — Jason L Mccormack
(74) *Attorney, Agent, or Firm* — Muir Patent Law, PLLC

(57) ABSTRACT

A substrate analysis system includes a load-lock module configured to load or unload a substrate on which a pattern layer is formed; a milling module configured to form a milling surface from which at least a portion of the pattern layer is removed; a depth measuring module configured to measure a milling depth of an analysis region formed on the milling surface; an imaging module configured to capture a two-dimensional image of the analysis region; and a control module controlling the substrate to circulate through the milling module, the depth measuring module, and the imaging module, when the milling depth is shallower than a set target depth, wherein the milling module adjusts a path of the ion beam so that the ion beam moves horizontally in the milling region according to a scanning profile received based on an intensity map of the ion beam.

20 Claims, 25 Drawing Sheets

(51) Int. Cl.
| | |
|---|---|
| *H01J 37/20* | (2006.01) |
| *H01J 37/304* | (2006.01) |
| *H01J 37/305* | (2006.01) |
| *H01J 37/147* | (2006.01) |

(52) U.S. Cl.
CPC ......... *H01J 37/305* (2013.01); *H01J 37/1472* (2013.01); *H01J 2237/049* (2013.01); *H01J 2237/20214* (2013.01); *H01J 2237/204* (2013.01); *H01J 2237/24578* (2013.01); *H01J 2237/2611* (2013.01); *H01J 2237/30483* (2013.01); *H01J 2237/31749* (2013.01)

(58) Field of Classification Search
CPC . H01J 22/22; H01L 21/67; G06T 7/50; G06T 7/0004; G01D 21/02; G01B 2210/56
USPC ....... 250/396 R, 492.1, 492.2, 492.21, 492.3
See application file for complete search history.

(56) References Cited

U.S. PATENT DOCUMENTS

| | | | |
|---|---|---|---|
| 9,627,176 B2 | 4/2017 | Bouchet-Marquis et al. | |
| 10,347,461 B2 | 7/2019 | Schmaunz et al. | |
| 10,541,107 B2 | 1/2020 | Fujiyoshi et al. | |
| 10,593,068 B2 | 3/2020 | Schoenmakers et al. | |
| 2003/0089852 A1* | 5/2003 | Ochiai .................. | H01J 37/256 |
| | | | 250/310 |
| 2012/0085923 A1* | 4/2012 | Coyle .................... | H01J 37/31 |
| | | | 250/453.11 |
| 2016/0086769 A1* | 3/2016 | Kim .................... | H01J 37/3005 |
| | | | 250/306 |
| 2017/0074755 A1* | 3/2017 | Adiga ...................... | G01N 1/36 |
| 2019/0198288 A1* | 6/2019 | Maazouz ............ | H01J 37/3056 |
| 2022/0262593 A1* | 8/2022 | Fischione ............. | H01J 37/147 |
| 2023/0245933 A1* | 8/2023 | Jiang .................. | H01J 37/3005 |
| | | | 438/5 |

* cited by examiner

S120

START

IRRADIATE MILLING REGION OF SUBSTRATE WITH
ION BEAM AT PREDETERMINED INCIDENT ANGLE — S121

ROTATE SUBSTRATE IN AZIMUTHAL DIRECTION
WITH MILLING REGION AT CENTER — S122

MOVE ION BEAM HORIZONTALLY ACCORDING TO
SCANNING PROFILE RECEIVED BASED
ON INCIDENT ANGLE — S123

CUMULATIVE DOSAGE VALUE OF ION
BEAM REACHES TARGET VALUE — S124

END

SUBSTRATE ANALYSIS SYSTEM

CROSS-REFERENCE TO RELATED APPLICATION

This application claims the priority and benefit of Korean Patent Application No. 10-2022-0125018, filed on Sep. 30, 2022, with the Korean Intellectual Property Office, the disclosure of which is incorporated herein by reference.

BACKGROUND

1. Field

Embodiments relate to a substrate analysis system.

2. Description of the Related Art

In accordance with the recent trend for high performance and high integration of semiconductor devices, microstructures are being formed on substrates. Therefore, in order to analyze a shape of the microstructures and improve yield of a manufacturing process, the development of a technology capable of three-dimensionally analyzing a substrate on which a micropattern layer is formed is required.

SUMMARY

According to an aspect of embodiments, provided is a substrate analysis system, the substrate analysis system, including: a load-lock module configured to load or unload a substrate on which a pattern layer is formed; a milling module configured to irradiate a milling region of the pattern layer with an ion beam to form a milling surface from which at least a portion of the pattern layer is removed; a depth measuring module configured to receive the substrate from the milling module, and measure a milling depth of an analysis region formed in a central portion of the milling surface; an imaging module configured to receive the substrate from the depth measuring module, and capture a two-dimensional image of the analysis region; a substrate transfer module configured to transfer the substrate between the load-lock module, the milling module, the depth measuring module, and the imaging module; and a control module controlling the substrate transfer module the substrate to circulate through the milling module, the depth measuring module, and the imaging module, when the milling depth obtained from the depth measuring module is shallower than a set target depth, wherein the milling module adjusts a path of the ion beam so that the ion beam moves horizontally within the milling region according to a scanning profile received based on an intensity map of the ion beam.

According to an aspect of embodiments, provided is a substrate analysis system, the substrate analysis system including: a milling module including a stage on which a substrate having a pattern layer formed thereon is seated, and an ion beam milling unit irradiating a milling region of the pattern layer with an ion beam to form a milling surface from which at least a portion of the pattern layer is removed in the milling region; a depth measuring module receiving the substrate from the milling module, and including a depth measuring unit, measuring a milling depth of an analysis region in the milling surface; an imaging module receiving the substrate from the depth measuring module, and including an image capturing unit, capturing a 2D image of the analysis region; a substrate transfer module configured to transfer the substrate between the milling module, the depth measuring module, and the imaging module, wherein the ion beam milling unit is configured to adjust a path of the ion beam according to a scanning profile for adjusting a dose of the ion beam.

According to an aspect of embodiments, provided is a substrate analysis system, the substrate analysis system including: a milling module including a stage on which a substrate having a pattern layer formed thereon is seated and an ion beam milling unit irradiating a milling region of the pattern layer with an ion beam at a predetermined incident angle to form a milling surface from which at least a portion of the pattern layer is removed in the milling region; a depth measuring module receiving the substrate from the milling module, and including a depth measuring unit measuring a milling depth of an analysis region in the milling surface; and an imaging module receiving the substrate from the depth measuring module, and including an image capturing unit capturing a 2D image of the analysis region, wherein the ion beam milling unit is configured to adjust a path of the ion beam according to a scanning profile received based on the incident angle of the ion beam.

According to an aspect of embodiments, provided is a substrate analysis method, the substrate analysis method including operations of: loading a substrate including a pattern layer formed on an upper surface and at least one fiducial hole disposed in a milling region of the pattern layer; inserting the substrate into a milling module and irradiating the milling region with an ion beam to form a milling surface, parallel to an upper surface of the substrate; inserting the substrate into a depth measuring module, and measuring a milling depth of an analysis region formed in a central portion of the milling surface using a remaining depth of the at least one fiducial hole; inserting the substrate into an imaging module and capturing a two-dimensional image of the analysis region; and sequentially reinserting the substrate into the milling module, the depth measuring module, and the imaging module, when the milling depth is shallower than a predetermined target depth.

BRIEF DESCRIPTION OF DRAWINGS

Features will become apparent to those of skill in the art by describing in detail exemplary embodiments with reference to the attached drawings in which.

DETAILED DESCRIPTION

Hereinafter, preferred example embodiments will be described with reference to the accompanying drawings as follows.

Figure 1A:
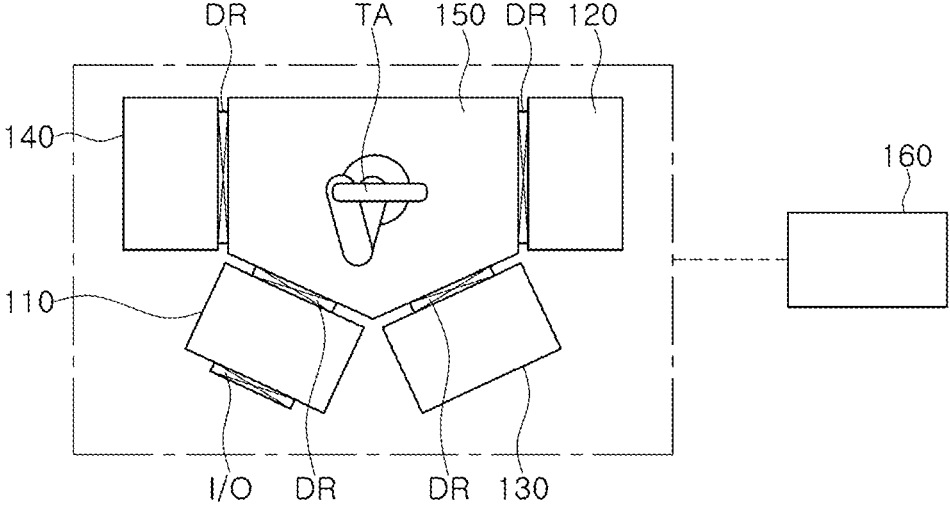
FIG. 1A is a diagram schematically illustrating a substrate analysis system according to an example embodiment.
Figure 1B:
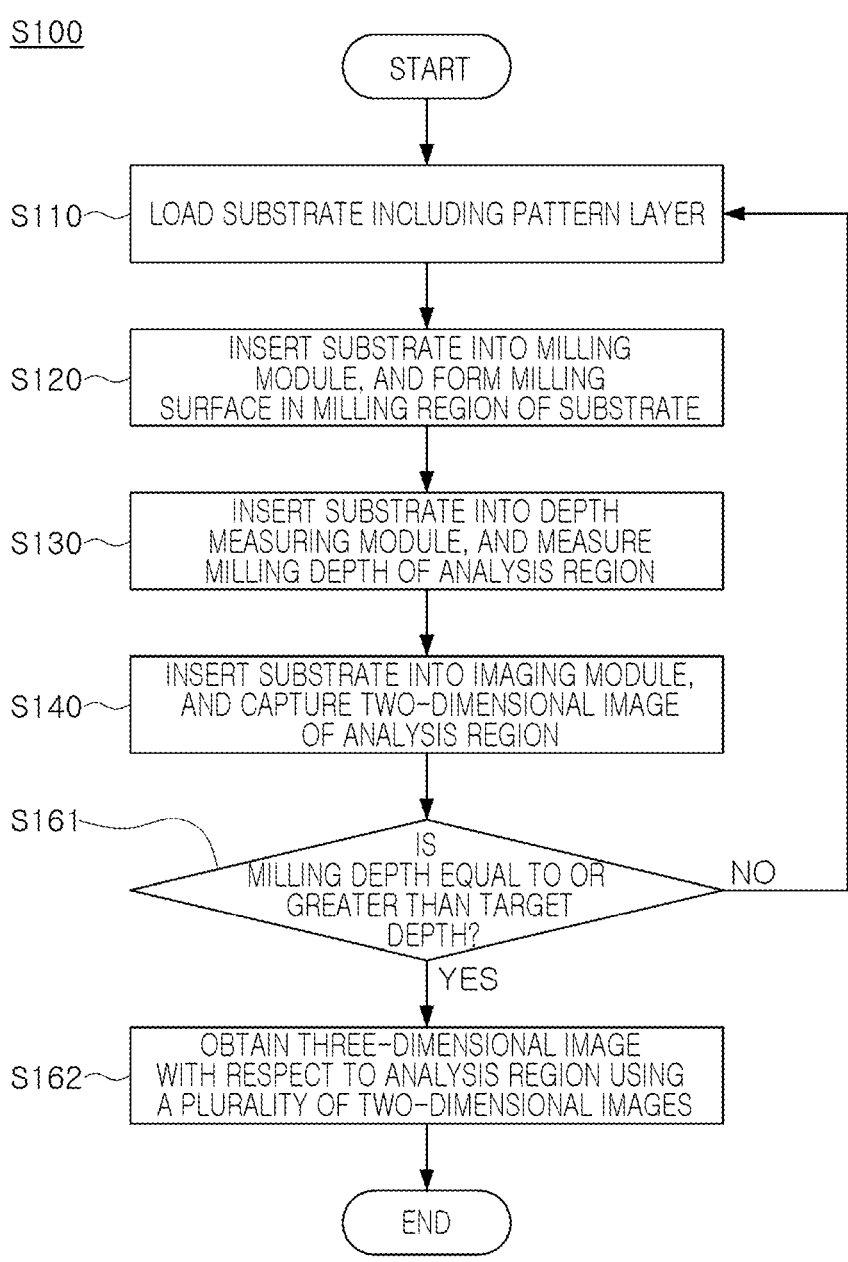
FIG. 1B is a flowchart schematically illustrating a substrate analysis process according to the substrate analysis system of FIG. 1A.

FIG. 1A is a diagram schematically illustrating a substrate analysis system 100 according to an example embodiment, and FIG. 1B is a flowchart schematically illustrating a substrate analysis method (S100) according to the substrate analysis system 100 of FIG. 1A.

Referring to FIG. 1A, the substrate analysis system 100 according to an example embodiment may include a milling module 120, a depth measuring module 130, and an imaging module 140. According to example embodiments, the substrate analysis system 100 may further include a load-lock module 110, a substrate transfer module 150, and/or a control module 160. For example, the substrate analysis system 100 may include multiple modules (e.g., multiple vacuum chambers) on a same platform, and may be a fully automated system within each vacuum chamber, e.g., a substrate may circulate through the multiple vacuum chambers.

In addition, referring to FIG. 1B, the substrate analysis method (S100) of an example embodiment may include an operation of loading an analysis object (S110), an operation of forming a milling surface (S120), an operation of measuring a milling depth (S130), an operation of capturing a two-dimensional (2D) image of an analysis region (S140), an operation of comparing the milling depth with a target depth (S161), and an operation of obtaining a three-dimensional (3D) image of the analysis region (S162).

Hereinafter, a substrate analysis method (S100) and modules performing each step of the substrate analysis method (S100) according to an example embodiment will be described.

First, an analysis object 10 (FIG. 2A) may be loaded through the load-lock module 110 (S110). For example, the analysis object 10 may be a substrate. Hereafter, the analysis object 10 and a substrate may be used interchangeably.

Referring to FIG. 1A, the load-lock module 110 (e.g., a load-lock) may be configured to load the analysis object 10 into the substrate analysis system 100 or unload the analysis object 10 from the substrate analysis system 100 after analysis is completed. For example, the analysis object 10 may be a substrate with a pattern layer on which fine patterns are formed. The substrate may be a semiconductor wafer containing, e.g., silicon, germanium, or silicon-germanium, or a specimen obtained by milling a semiconductor wafer into a predetermined size. The pattern layer may include various micro patterns for semiconductor devices. The substrate may include at least one fiducial hole. Depending on the example embodiment, the fiducial hole may be formed using, e.g., an ion gun or the like, after the substrate is loaded through the load-lock module 110.

The load-lock module 110 may include an input/output door (I/O) provided for loading and unloading of substrates. The input/output door (I/O) may be opened and closed during a process of loading and unloading the substrate. Depending on the example embodiment, the number of load-lock modules 110 may be variously changed. For example, the load-lock module 110 may include a loading load-lock and an unloading load-lock, respectively. The load-lock module 110 may be configured to control internal pressure in which a substrate is accommodated. For example, when a substrate is loaded, the pressure inside the load-lock module 110 (or chamber) may be controlled to have substantially the same pressure as an external environment (e.g., vacuum pressure or atmospheric pressure). The substrate loaded into the load-lock module 110 may be transferred to the milling module 120, the depth measuring module 130, and the imaging module 140 by the substrate transfer module 150 (e.g., substrate transferer).

The substrate transfer module 150 may be configured to transfer substrates between the load-lock module 110, the milling module 120, the depth measuring module 130, and the imaging module 140. The substrate transfer module 150 may be spatially connected to the load-lock module 110, the milling module 120, the depth measuring module 130, and the imaging module 140. For example, the substrate transfer module 150 may be configured to transfer the substrate loaded into the load-lock module 110 to the milling module 120, the depth measuring module 130, and the imaging module 140. A gate or a door DR may be disposed between the substrate transfer module 150 and each of the milling module 120, the depth measuring module 130, and the imaging module 140 to allow or block movement therethrough, e.g., entry and exit, of the substrate. Internal pressure of the substrate transfer module 150 may be controlled to have substantially the same vacuum pressure as internal pressures of the milling module 120, the depth measuring module 130, and the imaging module 140. The substrate transfer module 150 may include a transfer arm TA configured to load or unload a substrate, when the door DR is opened. The transfer arm TA may be disposed inside the substrate transfer module 150 and configured to unload the substrate from the load-lock module 110 to load the substrate into the milling module 120, the depth measuring module 130, and the imaging module 140. The transfer arm TA may be a robot arm configured to handle the substrate in a vacuum state.

Next, referring back to FIG. 1B, the substrate may be inserted into the milling module 120 using the substrate transfer module 150, and a milling surface may be formed on the substrate by irradiating a predetermined milling region with an ion beam (S120).

Figure 2A:
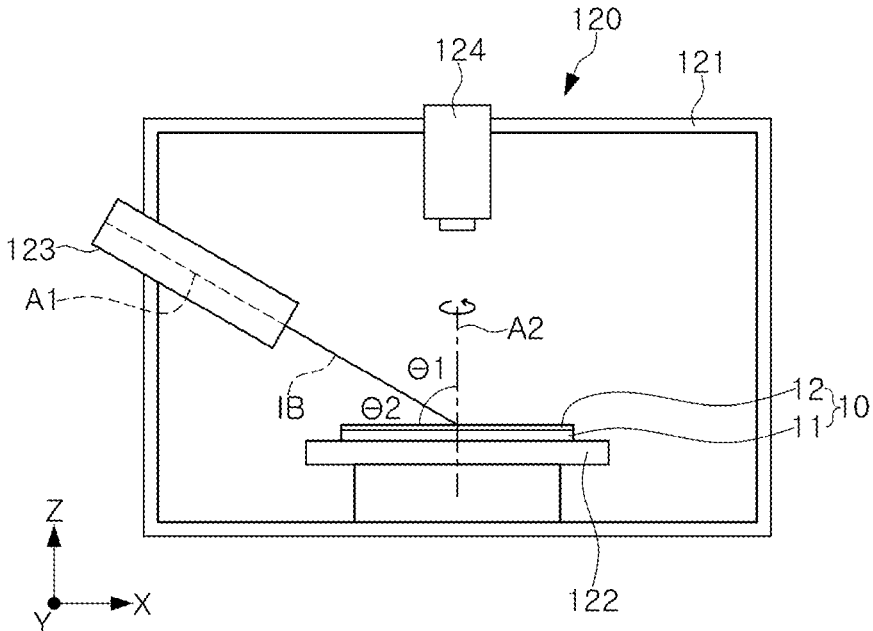
FIG. 2A is a diagram schematically illustrating a milling module applicable to a substrate analysis system according to an example embodiment.
Figure 2B:
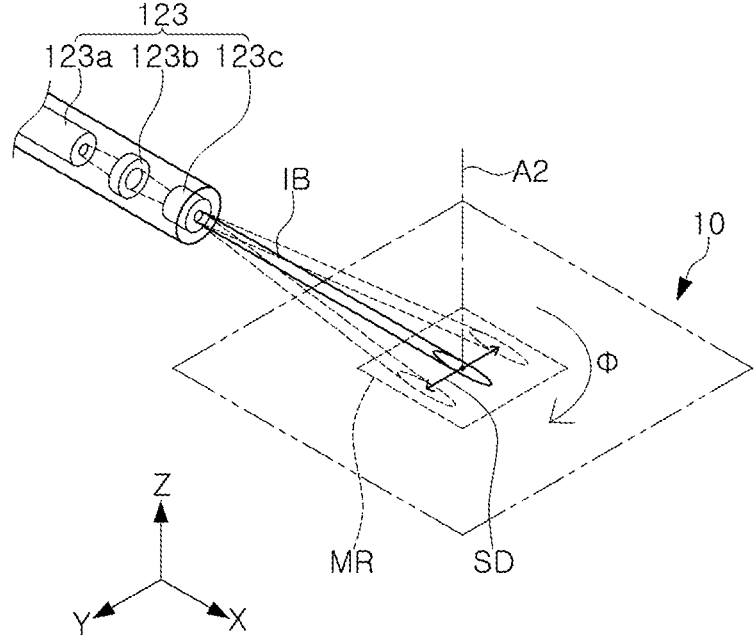
FIG. 2B is a perspective view illustrating a milling process of a substrate in the milling module of FIG. 2A.

The milling module 120 may be configured to irradiate the milling region of the substrate with an ion beam to form a milling surface from which at least a portion of a pattern layer in the milling region is removed (see FIGS. 2A and 2B). The milling module 120 may be configured to mill a substrate or a pattern layer in a top-down manner by scanning an ion beam on an upper surface of the substrate or pattern layer according to a scanning profile received from the control module 160 (e.g., controller). In addition, the milling module 120 may be configured to rotate the substrate around the milling region to which the ion beam is irradiated. Therefore, according to embodiments, a large-area milling surface or analysis region, parallel to an upper surface of the substrate may be formed in the milling region, as will be described in more detail below with reference to FIGS. 2A, 2B, and 6A.

Next, the substrate may be inserted into the depth measuring module 130 using the substrate transfer module 150, and a milling depth of the milling surface or analysis region may be measured using a remaining depth of at least one fiducial hole (S130).

The depth measuring module 130 may be configured to measure a milling depth of the analysis region formed by the milling process in operation S120. The depth measuring module 130 may obtain a milling depth by comparing a fiducial depth of a fiducial hole located in the analysis region with a depth remaining after the milling process, as will be described in more detail below with reference to FIGS. 10A to 10C For example, the substrate may be loaded through the load-lock module 110 in a state in which a fiducial hole is formed in advance. In this case, the depth measuring module 130 may measure the fiducial depth of the fiducial hole by receiving the substrate before being inserted into the milling module (e.g., before performing the milling process in the milling module 120). In another example, the fiducial hole may be formed using an ion gun or the like after the substrate is loaded through the load-lock module 110. The depth measuring module 130 may be configured to store information, e.g., a fiducial depth, a remaining depth, and a milling depth, or transfer the information to the control module 160.

Next, a substrate may be inserted into the imaging module 140 using the substrate transfer module 150, and a 2D image of the analysis region may be captured (S140).

The imaging module 140 may be configured to capture a 2D image of the analysis region, as will be described in more detail below with reference to FIG. 12. For example, the imaging module 140 may include a scanning electron microscope (SEM). The imaging module 140 may be configured to capture and store a plurality of 2D images, or transfer the images to the control module 160, corresponding to the analysis region to which the milling process has been applied a plurality of times. Depending on the example embodiment, the imaging module 140 may receive a substrate before being inserted into the milling module, and capture a 2D image of the analysis region or the milling region before the milling process is applied.

Depending on the embodiment, before the substrate is loaded into the milling module 120, an operation of putting the substrate into the imaging module 140 and obtaining a 2D image of an uppermost surface of a pattern layer corresponding to the analysis region may be further included.

Next, the above-described process may be repeatedly performed, by comparing a milling depth obtained from the depth measuring module 130 with a predetermined target depth (S161). When the milling depth is shallower than the predetermined target depth, the substrate may be sequentially reinserted into the milling module 120, the depth measuring module 130, and the imaging module 140 using the substrate transfer module 150. When the milling depth is equal to or greater than the target depth, a 3D image of the analysis region may be obtained using the plurality of 2D images obtained from the imaging module 140 (S162). The above-described process may be performed by the control module 160 that controls the modules 110, 120, 130, and 140.

The control module 160 may be connected to the load-lock module 110, the milling module 120, the depth measuring module 130, and the imaging module 140 through a data bus. The control module 160 may be configured to store and process data provided from the milling module 120, the depth measuring module 130, and the imaging module 140. The control module 160 may terminate or proceed with an operation of the substrate analysis system 100 based on data provided from the depth measuring module 130. For example, when the milling depth ('h3' in FIG. 10C) is equal to or greater than the target depth ('h4' in FIG. 10C), the control module 160 may obtain a 3D image of the analysis region using the plurality of 2D images obtained from the imaging module 140, and terminate an operation of the substrate analysis system 100. For example, when a milling depth ('h3' in FIG. 10C) obtained from the depth measuring module 130 is shallower than a set target depth ('h4' in FIG. 10C), the control module 160 may control respective modules 110, 120, 130, 140, and 150 so that the substrate cycles through the milling module 120, the depth measuring module 130, and the imaging module 140 until the milling depth reaches the target depth.

The control module 160 may provide a scanning profile of an ion beam to the milling module 120. Alternatively, the control module 160 may control the milling module 120 to irradiate ion beams according to a preset scanning profile. According to embodiments, a large-area milling surface having excellent uniformity may be formed by performing a milling process of a substrate according to a scanning profile determined based on characteristics of an ion beam, e.g., the scanning profile refers to a change of a position of the ion beam over time. The scanning profile may be determined based on an intensity map of the ion beam and/or an incidence angle to the milling region. Details thereof will be described later with reference to FIGS. 4A, 4B, 8A, and 8B.

According to example embodiments, the control module 160 may include an input/output unit and an interface unit. The input/output unit may include, e.g., a keyboard, a keypad, and/or a display device. The interface unit may include, e.g., wired elements, wireless elements, and/or universal serial bus (USB) ports, and the like. Through the interface unit, image data obtained from the imaging module 140 may be transferred to the control module 160, or data processed by the control module 160 may be transferred to the modules 110, 120, 130, 140, 150 or an external device (e.g., a data server).

Hereinafter, components of the milling module 120 and a milling process using the same will be described with reference to FIGS. 2A, 2B, 2C, and 3.

Figure 2C:
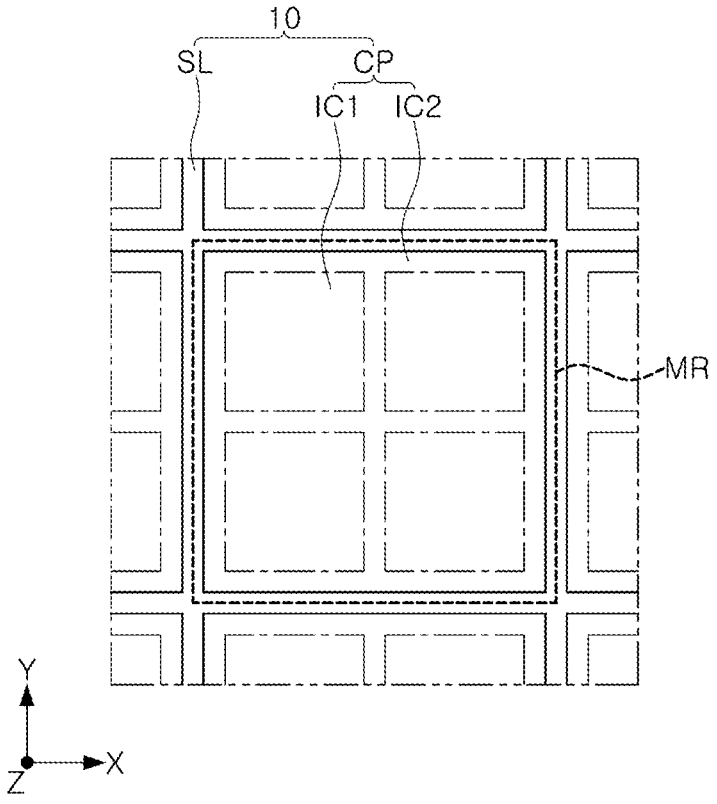
FIG. 2C is a plan view illustrating one region of a substrate to which an ion beam is irradiated.
Figure 3:
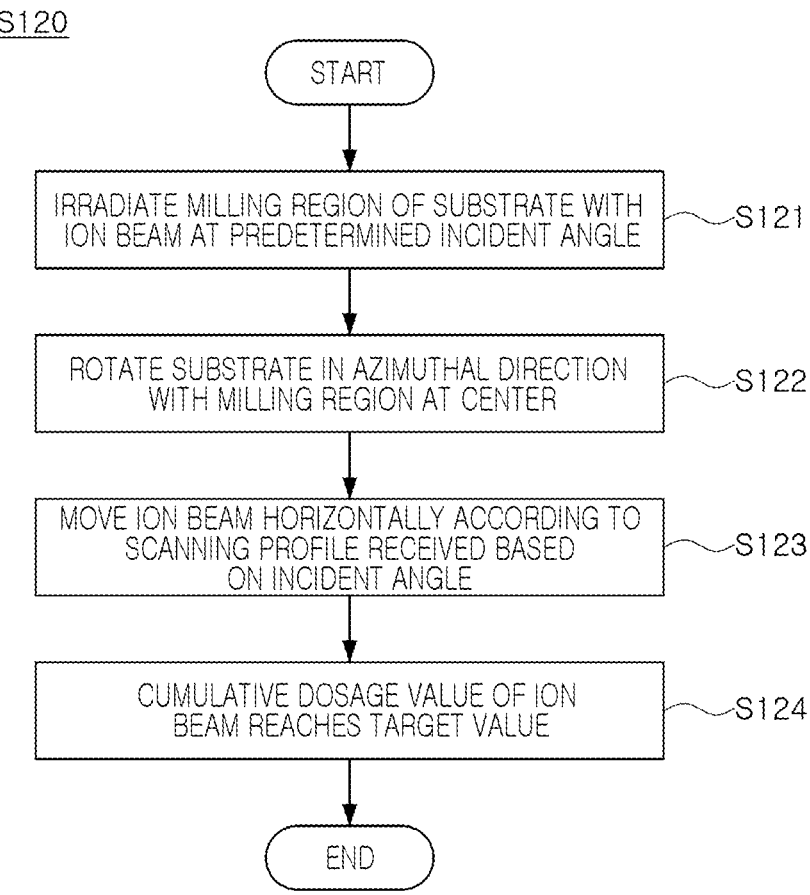
FIG. 3 is a flowchart schematically illustrating a substrate milling process according to the milling module of FIG. 2A.

FIG. 2A is a diagram schematically illustrating a milling module 120 applicable to the substrate analysis system 100 according to an example embodiment, FIG. 2B is a perspective view illustrating a milling process of a substrate in the milling module 120 of FIG. 2A, and FIG. 2C is a plan view illustrating one region of the substrate to which the ion beam IB is irradiated. FIG. 3 is a flowchart schematically illustrating a substrate milling process (S120) according to the milling module 120 of FIG. 2A.

Referring to FIGS. 2A to 3, the milling module 120 (e.g., a miller) of an example embodiment may include a chamber 121 (e.g., a first chamber), a stage 122 (e.g., a first stage), and an ion beam milling unit 123 (e.g., an ion mill). According to example embodiments, the milling module 120 may further include an image sensor 124. The image sensor 124 may be disposed in an upper portion of the chamber 121, e.g., above the stage 122. The image sensor 124 may be configured to obtain image information, e.g., a milling region MR, a size of an ion beam IB, and a scan region of the ion beam IB. For example, image sensor 124 may include a complementary metal oxide semiconductor (CMOS) or a charge coupled device (CCD) sensor.

As illustrated in FIG. 3, the substrate milling process (S120) of an example embodiment may include irradiating a milling region MR of a substrate 10 with an ion beam IB (S121), rotating the substrate 10 (S122), and moving the ion beam IB (S123). For example, the substrate milling process (S120) may be terminated when a cumulative dosage value of the ion beam IB reaches a target value (S124).

In embodiments, the milling module 120 may be configured so that a portion of the milling region MR (e.g., an analysis region ('IR' in FIG. 5A)) is a portion of a pattern layer 12 parallel to an upper surface of the substrate 10. The milling module 120 may be configured to adjust a movement path of the ion beam IB. The milling module 120 may control the movement path of the ion beam IB so that the ion beam IB reciprocates, e.g., moves, horizontally (e.g., in a Y direction) within the milling region MR according to a scanning profile for adjusting a dose of the ion beam IB. For example, the movement direction SD of the ion beam IB may be defined as a direction perpendicular to a beam axis (hereinafter, a first axis A1) of the ion beam IB, or a short axis direction of an elliptical beam spot formed on the substrate 10.

For example, the scanning profile may be configured so that the ion beam IB reciprocates in the milling region MR in one direction SD (see FIG. 2B), and the dose of the ion beam at an edge of the milling region MR is increased. For example, the scanning profile may be received based on an intensity map of the ion beam IB (see FIGS. 4A and 4B).

Figure 4A:
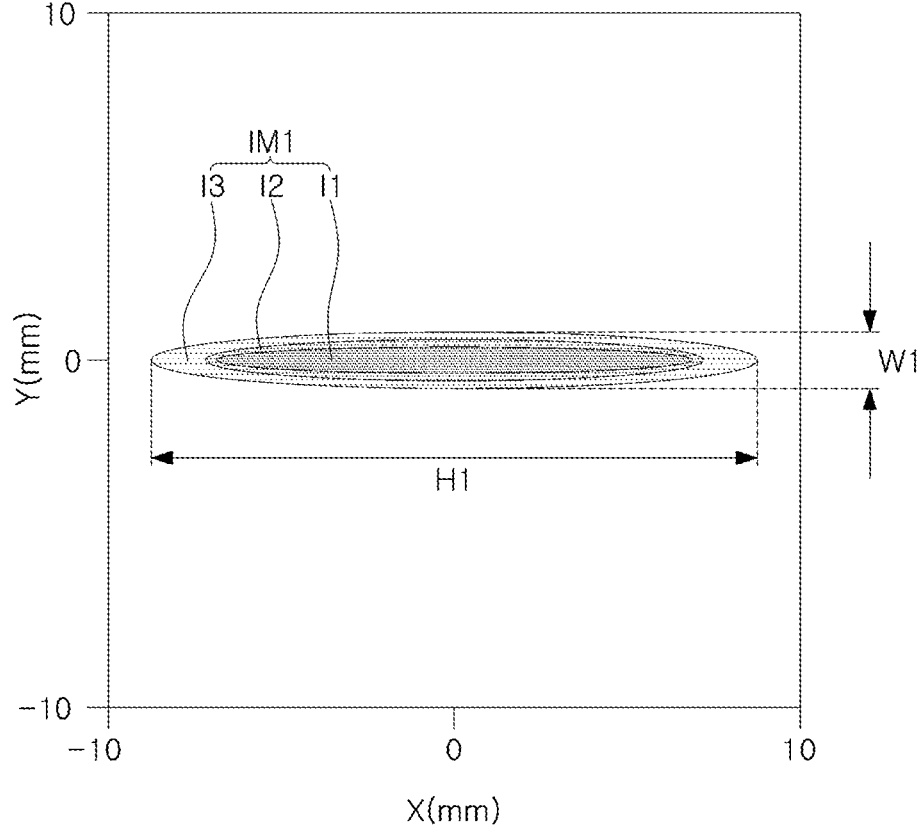
FIG. 4A is a diagram illustrating an intensity map of an ion beam according to an example embodiment in a predetermined milling region.
Figure 4B:
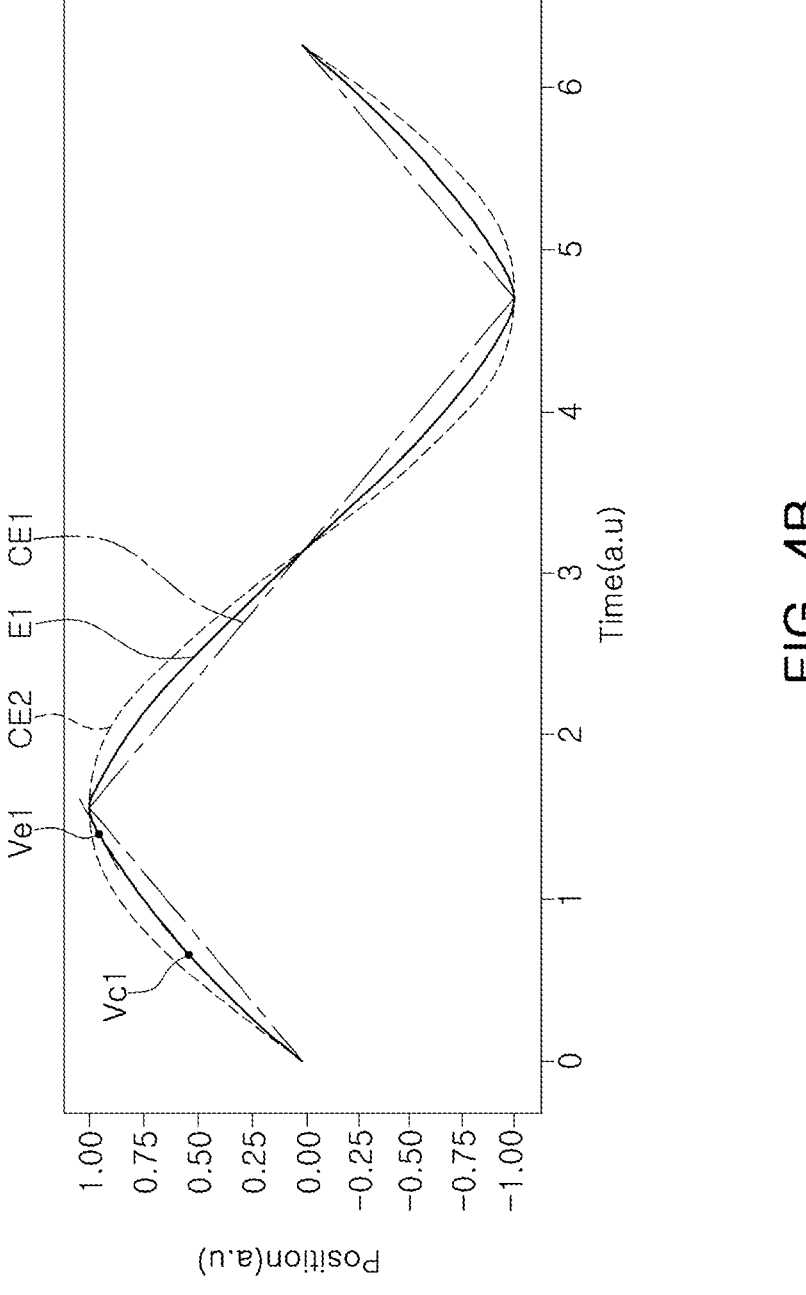
FIG. 4B is a graph illustrating scanning profiles according to Examples and Comparative Examples.

For example, the scanning profile may be configured to adjust a moving speed of the ion beam IB based on an incident angle θ1 of the ion beam IB with respect to the milling region MR (see FIGS. 4A and 4B). The scanning profile may be configured so that the ion beam IB having a relatively small incident angle θ1 has a relatively slow moving speed at the edge of the milling region MR (see FIGS. 4A, 4B 8A and 8B). For example, the scanning profile may be configured so that root mean square roughness (Rq) of a graph of cumulative dosage values of the ion beam IB irradiated toward the analysis region ('IR' in FIG. 5A) is minimized (see FIGS. 5A to 5C).

Therefore, according to the substrate analysis system 100, a large-area milling surface having excellent uniformity may be formed, and fine patterns may be more accurately analyzed. That is, by setting a scanning profile according to an intensity map of an ion beam, a large-area milling area (i.e., an area of interest) having excellent uniformity may be formed.

In detail, referring to FIG. 2A, the substrate 10 may include a base layer 11 and a pattern layer 12. The base layer 11 may be a wafer including a semiconductor material. The pattern layer 12 may be formed of any of, e.g., a semiconductor material, a conductive material, and an insulating material, or a combination thereof. Here, the semiconductor material may be a semiconductor substrate or an epitaxial layer, the conductive material may be formed of, e.g., doped polysilicon, metal silicide, metal, metal nitride, or a combination thereof, and the insulating material may include, e.g., silicon oxide, silicon nitride, silicon acid nitride, or a low-k material having a dielectric constant lower than that of the silicon oxide. For example, the pattern layer 12 may include crystalline silicon, amorphous silicon, impurity-doped silicon, silicon germanium, or a carbon-based material film. In addition, the pattern layer 12 may be formed of a single film or a stacked film in which a plurality of films are stacked. For example, the pattern layer 12 may include a plurality of stacked insulating films, and may include a conductive film or a semiconductor film between the stacked insulating films.

As illustrated in FIG. 2C, the substrate 10 may include a plurality of chip regions CP and a scribe line SL. The chip regions CP may be regions in which semiconductor chips are formed. For example, the chip regions CP may include a core circuit IC1 and a peripheral circuit IC2. The core circuit IC1 may include, e.g., a plurality of memory cells, a plurality of word lines, and a plurality of bit lines. The peripheral circuit IC2 may include individual elements (e.g., transistors), electrically connected to the core circuit IC1. The scribe line SL may be a region separating and/or dividing the chip regions CP. At least one milling region MR may be set in the substrate 10. For example, the milling region MR may include a plurality of core circuits IC1 and a plurality of peripheral circuits IC2. For example, the milling region MR may be a virtual region having an area of 20 mm×20 mm on a plane (X-Y plane) that overlaps a plurality of core circuits IC1 and a plurality of peripheral circuits IC2 on the substrate 10.

As illustrated in FIG. 2A, the chamber 121 may have an internal space independent from the outside. Elements such as the stage 122 and the ion beam milling unit 123 may be disposed in the internal space of the chamber 121. Depending on the example embodiment, some elements may be disposed outside the chamber 121. The internal space of the chamber 121 may be in a low-pressure state, e.g., about 5 Pa or less, or in a vacuum state to prevent the ion beam IB from being absorbed by gas.

The stage 122 may be disposed at a lower portion of the chamber 121. The stage 122 may be configured to temporarily fix the substrate 10 seated on an upper surface thereof. The stage 122 may be configured to change a position of the substrate 10, in order to change a region to which an ion beam IB is irradiated. For example, the stage 122 may be configured to move the substrate 10 in horizontal directions (X and Y directions). In addition, as illustrated in FIG. 2B, when the ion beam IB is irradiated to the milling area MR, the stage 122 may be configured to rotate the substrate 10 in an azimuthal direction (φ) with the milling region (MR) at a center thereof. For example, the stage 122 may be configured to rotate around a second axis A2, perpendicular to an upper surface of the substrate 10. The second axis A2 may be a central axis passing through a center of the substrate 10, a center of the milling region MR, or a center of the analysis region ('IR' in FIG. 5A). Depending on the example embodiment, the second axis A2 may not coincide with the central axis of the substrate 10. For example, the stage 122 may move the substrate 10 in the X direction and the Y direction so that the second axis A2 is formed at an arbitrary position of the substrate 10. Depending on the example embodiment, the stage 122 may be configured to move the substrate 10 in a vertical direction (Z direction). For example, the stage 122 may move the substrate 10 in the Z direction, so that the first axis A1 of the ion beam IB, of which an incident angle $\theta 1$ is adjusted by an ion beam deflector 123c, passes through the center of the milling region MR. Depending on the example embodiment, the stage 122 may be configured to rotate about an axis in the X and/or Y directions to adjust the incident angle $\theta 1$ of the ion beam IB.

The ion beam milling unit 123 may be configured to form a milling surface from which at least a portion of the pattern layer 12 is removed by irradiating the ion beam IB at a predetermined incident angle $\theta 1$ in the milling region MR. The incident angle $\theta 1$ of the ion beam IB may be an angle between a normal line perpendicular to the upper surface of the substrate 10 and the first axis A1 of the ion beam IB. The first axis A1 of the ion beam IB may have a predetermined angle 62 with the upper surface of the substrate 10. The ion beam IB irradiated onto the substrate 10 may be formed in various shapes (e.g., intensity maps) according to the incident angle $\theta 1$. The ion beam milling unit 123 may include a focused ion beam (FIB). As illustrated in FIG. 2B, the ion beam milling unit 123 may include an ion beam generator 123a configured to generate the ion beam IB, an ion beam collimator 123b configured to focus the ion beam oscillated from the ion beam generator 123a, and an ion beam deflector 123c configured to deflect a path of the ion beam IB focused by the ion beam collimator 123b, e.g., the ion beam generator 123a, the ion beam collimator 123b, and the ion beam deflector 123c may be arranged coaxially along the first axis A1. The ion beam generator 123a, the ion beam collimator 123b, and the ion beam deflector 123c may be configured to use electric or electromagnetic fields.

Hereinafter, cumulative dosages according to the scanning profiles of Example 1 and Comparative Examples 1 and 2 will be described with reference to FIGS. 4A to 5C.

FIG. 4A is a diagram illustrating an intensity map IM1 of an ion beam according to Example 1 in a predetermined milling region.

Referring to FIG. 4A, the intensity map IM1 of Example 1 represents intensity of an ion beam IB irradiated onto the substrate 10 at a predetermined incident angle $\theta 1$. For example, the incident angle $\theta 1$ may be about 80 degrees, and an angle $\theta 2$ between the first axis A1 of the ion beam IB and the upper surface of the substrate 10 may be about 10 degrees. The intensity map IM1 of Example 1 may have a first region I1, a second region I2, and a third region I3 within a predetermined region (e.g., within a milling region MR of 20 mm×20 mm). Each of the first region I1, the second region I2, and the third region I3 may be a region schematically representing a region having intensity within a certain range. A boundary between the first region I1, the second region I2, and the third region I3 may not be clearly distinguished. The first region I1, the second region I2, and the third region I3 may sequentially represent regions having lower intensity (e.g., with highest intensity in the first region I1). For convenience of description, the intensity map IM1 of Example 1 is illustrated as three regions, but the intensity map IM1 of Example 1 may substantially include three or more regions. The intensity map IM1 of Example 1 may have a first aspect ratio (e.g., a ratio of a width W1 to a height H1). For example, the intensity map IM1 of Example 1 may have a width W1 of about 2 mm and a height H1 of about 18 mm.

FIG. 4B is a graph illustrating scanning profiles E1, CE1, and CE2 according to Example 1 and Comparative Examples. The scanning profiles E1, CE1, and CE2 of FIG. 4B illustrate a change in position of the ion beam IB over time. Here, "time" and "position" may be defined as an arbitrary unit (a.u.). For example, amplitudes of the scanning profiles E1, CE1, and CE2 may correspond to a scan range (e.g., +10 mm) of the ion beam IB with respect to a center of the milling region.

Referring to FIG. 4B, the scanning profile E1 of Example 1 (i.e., solid line in FIG. 4B) may be configured so that a dose of the ion beam increases at an edge (a position of ±1.00) of the milling region MR. The scanning profile E1 of Example 1 may be configured so that a moving speed of the ion beam IB decreases closer to the edge (the position of ±1.00) of the milling region MR. For example, in view of the intensity map IM1 of FIG. 4A (with the highest intensity in the center of the milling region MR), the scanning profile E1 of Example 1 may be configured to decrease the moving speed of the ion beam IB closer to the edge in order to increase the dose of the ion beam IB at the edge, thereby increasing the intensity and dosage uniformity in the milling region MR. For example, in the scanning profile E1 of Example 1, a moving speed Ve1 of the ion beam IB at a position of about +0.85 may be slower than a moving speed Ve1 of the ion beam IB at a position of about +0.50. Here, a movement direction of the ion beam IB may be a direction perpendicular to a beam axis of the ion beam IB, or a minor-axis direction of an elliptical beam spot formed on the substrate 10.

The scanning profile E1 of Example 1 may be received based on an intensity map of the ion beam IB. In an example embodiment, the moving speed Ve1 of the ion beam IB at an edge of the milling region MR may decrease as an aspect ratio of the intensity map of the ion beam IB decreases.

The scanning profile E1 of Example 1 may be configured to adjust a moving speed of the ion beam IB based on an incident angle $\theta 1$ of the ion beam IB with respect to the milling region MR.

The scanning profile E1 of Example 1 may be configured so that root mean square roughness (Rq) of the cumulative dosage value graph of the ion beam IB irradiated to the analysis region ('IR' in FIG. 5A) is minimized.

The scanning profile E1 of Comparative Example 1 may be configured so that the moving speed of the ion beam IB is constant throughout the milling region MR. In the scanning profile CE1 of Comparative Example 1, a moving speed of the ion beam IB at a position of about +0.85 and a moving speed of the ion beam IB at a position of about +0.50 may be substantially the same.

The scanning profile CE2 of Comparative Example 2 may be configured so that a dose of the ion beam at an edge of the milling region MR is further increased than that of the scanning profile E1 of Example 1. At the edge of the milling region MR, the moving speed of the ion beam IB according to the scanning profile CE2 of the second Comparative Example 2 is slower than the moving speed of the ion beam IB according to the scanning profile E1 of Example 1. For example, the moving speed of the ion beam IB according to the scanning profile CE2 of the second Comparative Example at the position of about +0.85 may be slower than the moving speed of the ion beam IB according to the scanning profile E1 of Example 1.

Figure 5A:
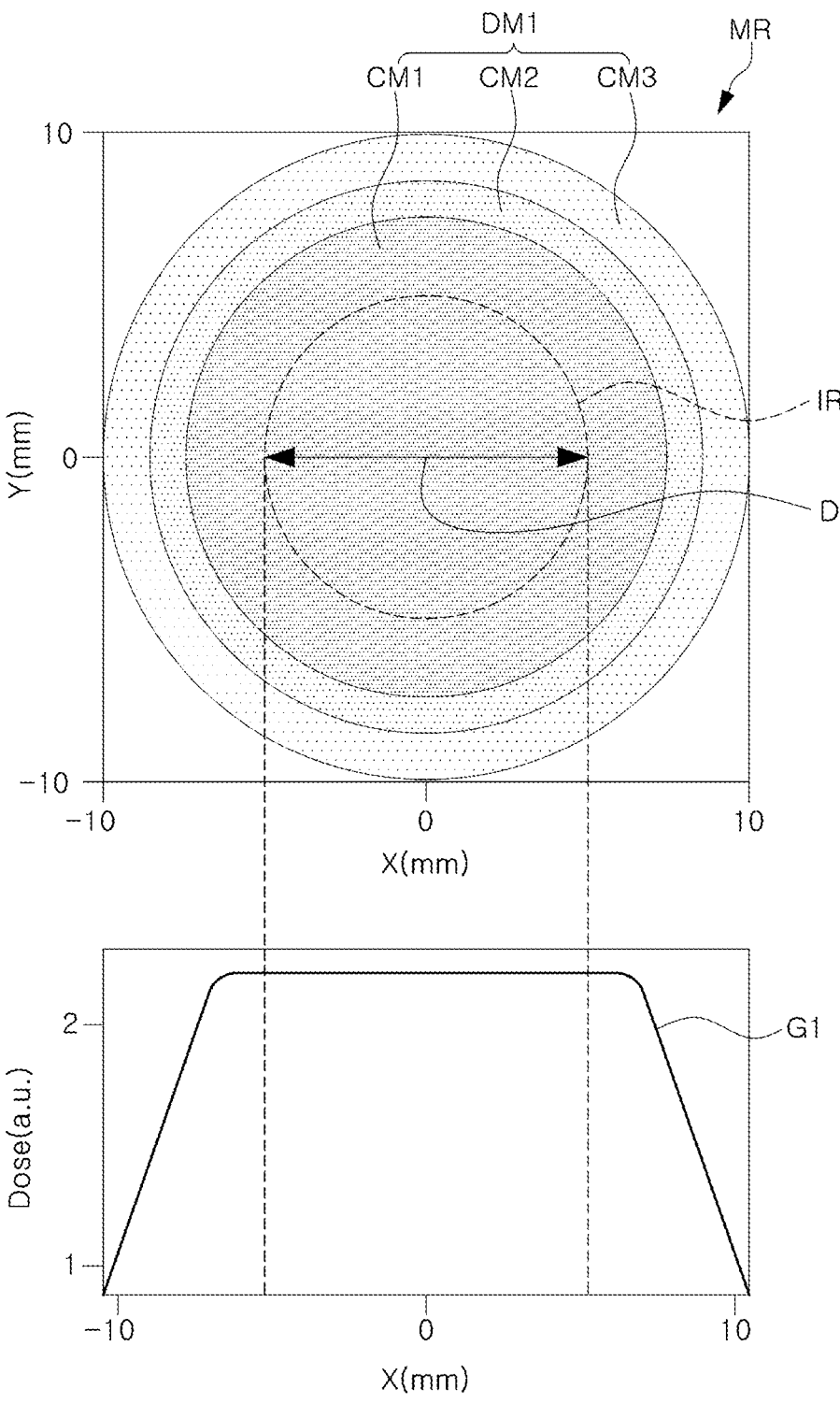
FIG. 5A is a cumulative dosage map and graph illustrating a dosage amount of an ion beam accumulated in a predetermined milling region when the ion beam of FIG. 4A is scanned according to a scanning profile of Example 1.

FIG. 5A is a cumulative dosage map DM1 and a dosage value graph G1 illustrating a dosage amount of an ion beam accumulated in a predetermined milling region MR when the ion beam of FIG. 4A is scanned according to a scanning profile E1 of Example 1.

Referring to FIG. 5A, a cumulative dosage map DM1 of Example 1 illustrates a dosage amount accumulated in a milling region MR according to the scanning profile E1 of Example 1 while the substrate 10 is rotated about the milling region MR. The dosage map DM1 of Example 1 may have a first cumulative region CM1, a second cumulative region CM2, and a third cumulative region CM3 within a predetermined region (e.g., a 20 mm×20 mm milling region MR). On a plane (e.g., in a top view), the first cumulative region CM1 may have a circular shape, and each of the second cumulative region CM2 and the third cumulative region CM3 may have an annular shape surrounding the first cumulative region CM1. Each of the first cumulative region CM1, the second cumulative region CM2, and the third cumulative region CM3 may be a region schematically representing a region having a cumulative dosage amount within a certain range. A boundary between the first cumulative region CM1, the second cumulative region CM2, and the third cumulative region CM3 may not be clearly distinguished. The first cumulative region CM1, the second cumulative region CM2, and the third cumulative region CM3 may be regions of sequentially lower cumulative dosage amounts, e.g., with highest constant dosage in the first cumulative region CM1. For convenience of description, the dosage map DM1 of Example 1 is illustrated as three regions, but substantially the dosage map DM1 of Example 1 may include three or more regions. According to the intensity map IM1 of Example 1 and the scanning profile E1 of Example 1, a first cumulative region CM1 having a diameter of about 10 mm or more may be formed. As a result, by uniformly controlling a milling depth of the substrate 10 by the ion beam IB within the analysis region IR, a large-area analysis region IR having excellent uniformity may be formed within the milling region MR.

The cumulative dosage value graph G1 of Example 1 illustrates a dosage amount of the ion beam IB, accumulated with respect to an axis passing through a center of the milling region MR in the X direction. The scanning profile E1 of the first embodiment may be configured such that root mean square roughness Rq of the cumulative dosage value graph G1 is minimized. Within the analysis region IR, the root mean square roughness Rq of the cumulative dosage value graph G1 of the first embodiment may be about 0.01 or less, e.g., may be in a range of about 0.008 to about 0.0001, about 0.01 to about 0.001, about 0.008 to about 0.001, about 0.005 to about 0.001, and the like. According to the first embodiment, a diameter D1 of the analysis region IR may be greater than or equal to about 8 mm. That is, the analysis region IR is set to a central portion of the first cumulative region CM1, spaced apart by an arbitrary distance from the boundary between the first cumulative region CM1 and the second cumulative region CM2.

Figure 5B:
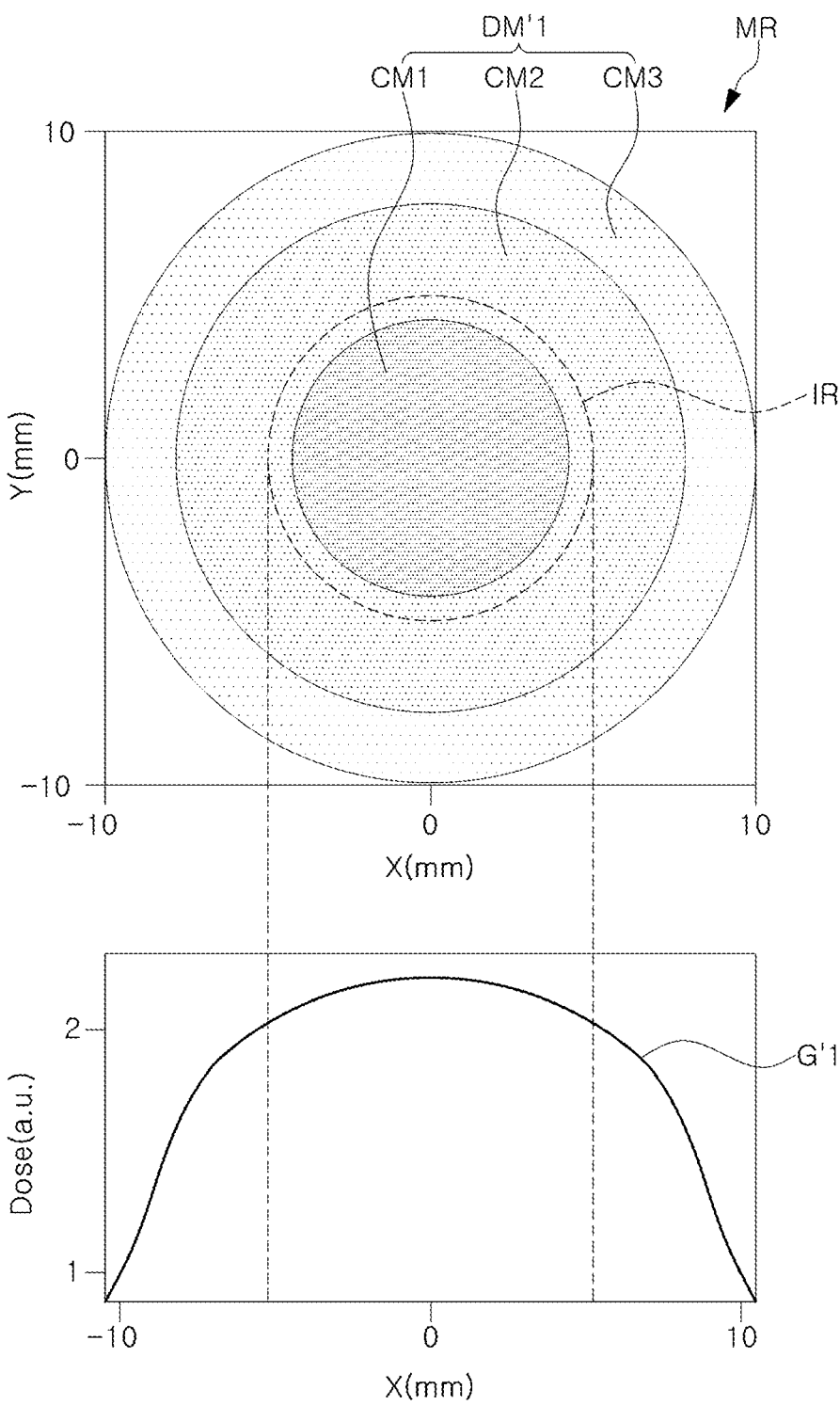
FIG. 5B is a cumulative dosage map and graph illustrating a dosage amount of an ion beam accumulated in a predetermined milling region when the ion beam of FIG. 4A is scanned according to a scanning profile of Comparative Example 1.

FIG. 5B is a cumulative dosage map DM'1 and a dosage value graph G'1 illustrating a dosage amount of an ion beam accumulated in a predetermined milling region MR, when the ion beam of FIG. 4A is scanned according to a scanning profile CE1 of Comparative Example 1.

Referring to FIG. 5B, the cumulative dosage map DM'1 of Comparative Example 1 illustrates a dosage amount of the ion beam IB accumulated according the scanning profile CE1 of Comparative Example 1 while the substrate 10 is rotated around the milling region MR. In the dosage map DM'1 of Comparative Example 1, the first cumulative region CM1, the second cumulative region CM2, and the third cumulative region CM3 may be understood as having a region having an accumulated dosage amount in a range corresponding to the first cumulative region CM1, the second cumulative region CM2, and the third cumulative region CM3 of Example 1, respectively (e.g., sizes, rather than dosages, of the regions may be different). The first cumulative region CM1 of the first comparative example may be formed to have a smaller area than the first cumulative region CM1 of the first embodiment. For example, the first cumulative region CM1 of the first comparative example may be formed to have a smaller area than the analysis region IR set in the first embodiment. For example, since the scanning profile CE1 of Comparative Example 1 is triangular (e.g., constant speed) rather that sine-shaped, the amount of milling is smaller because the ion beam irradiation time in the milling area boundary is relatively smaller. In addition, within the analysis region IR, the root mean square roughness Rq of the cumulative dosage value graph G'1 of Comparative Example 1 may be about 0.01 or more (e.g., about 0.05 or more). That is, according to the first comparative example, it may be difficult to uniformly control the milling depth by the ion beam IB in a region corresponding to the analysis region IR of Example 1. This will be described in more detail with reference to FIGS. 6A to 7B.

Figure 5C:
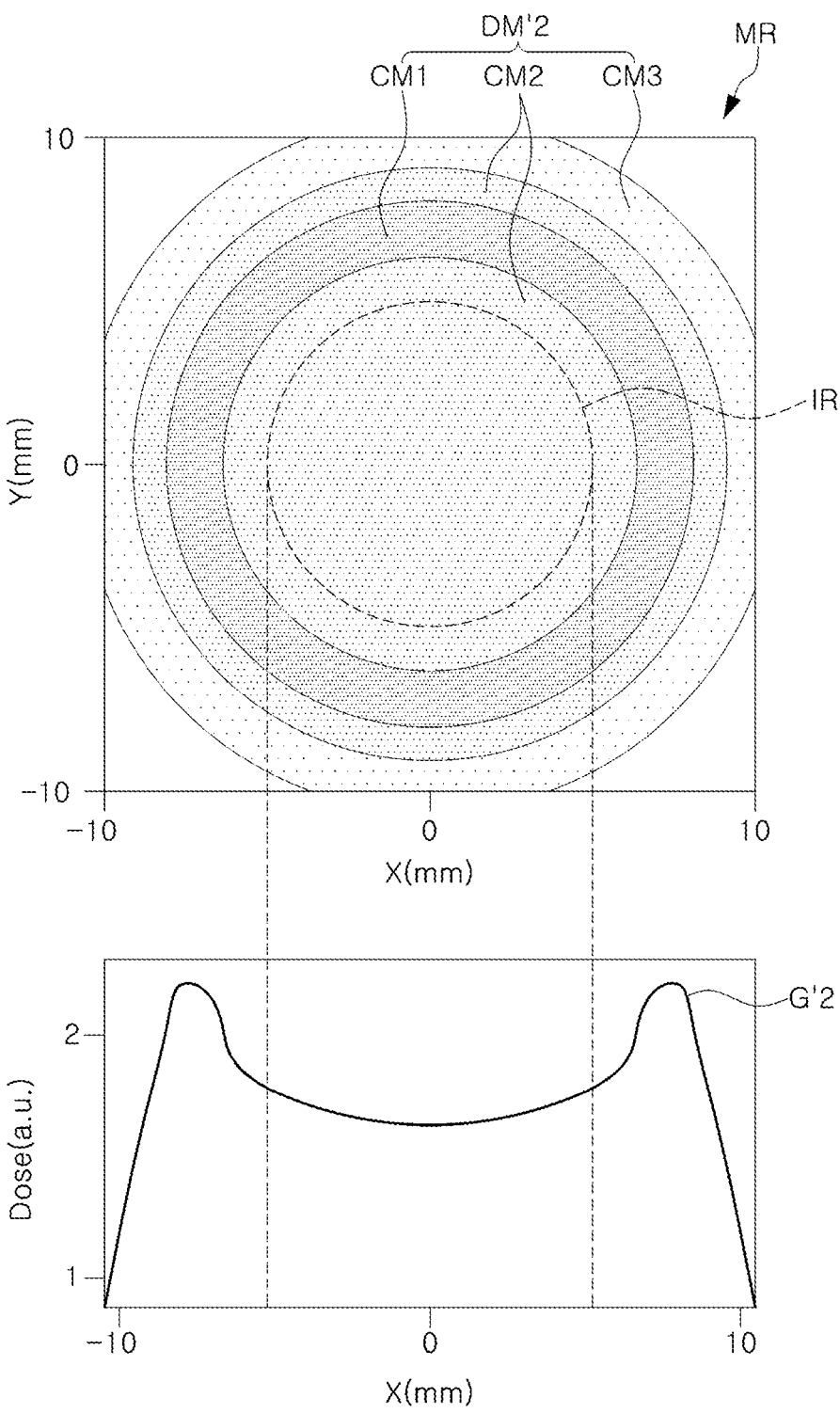
FIG. 5C is a cumulative dosage map and graph illustrating a dosage amount of an ion beam accumulated in a predetermined milling region when the ion beam of FIG. 4A is scanned according to a scanning profile of Comparative Example 2.

FIG. 5C is a cumulative dosage map DM'2 and a dosage value graph G'2 illustrating a dosage amount of the ion beam accumulated in a predetermined milling region MR, when the ion beam of FIG. 4A is scanned according to a scanning profile CE2 of Comparative Example 2.

Referring to FIG. 5C, the cumulative dosage map DM'2 of Comparative Example 2 illustrates a dosage amount of the ion beam IB accumulated according the scanning profile CE2 of Comparative Example 2, while the substrate 10 is rotated around the milling region MR. In the dosage map DM'2 of Comparative Example 2, the first cumulative region CM1, the second cumulative region CM2, and the third cumulative region CM3 may be understood as having a region having an accumulated dosage amount in a range corresponding to the first cumulative region CM1, the second cumulative region CM2, and the third cumulative region CM3 of Example 1, respectively (e.g., sizes and arrangement, rather than dosages, of the regions may be different). In the accumulation dosage map DM'2 of Comparative Example 2, a second cumulative region CM2 may be formed at a center of the milling region MR. For example, the second cumulative region CM2 of Comparative Example 2 has a circular portion located at the center of the milling region MR and an annular portion, spaced apart from the circular portion, and the first cumulative region CM1 is located between the circular portion and the annular portion of the second cumulative region CM2. In addition, within the analysis region IR, the root mean square roughness Rq of the cumulative dosage value graph G'2 of Comparative Example 2 may be about 0.01 or more (e.g., about 0.015 or more). That is, according to the Comparative Example 2, it may be difficult to uniformly control the milling depth by the ion beam IB in a region corresponding to the analysis region IR of Example 1.

Hereinafter, an analysis region IR formed on the substrate 10 according to the scanning profile E1 of Example 1 will be described with reference to FIGS. 6A to 7B.

Figure 6A:
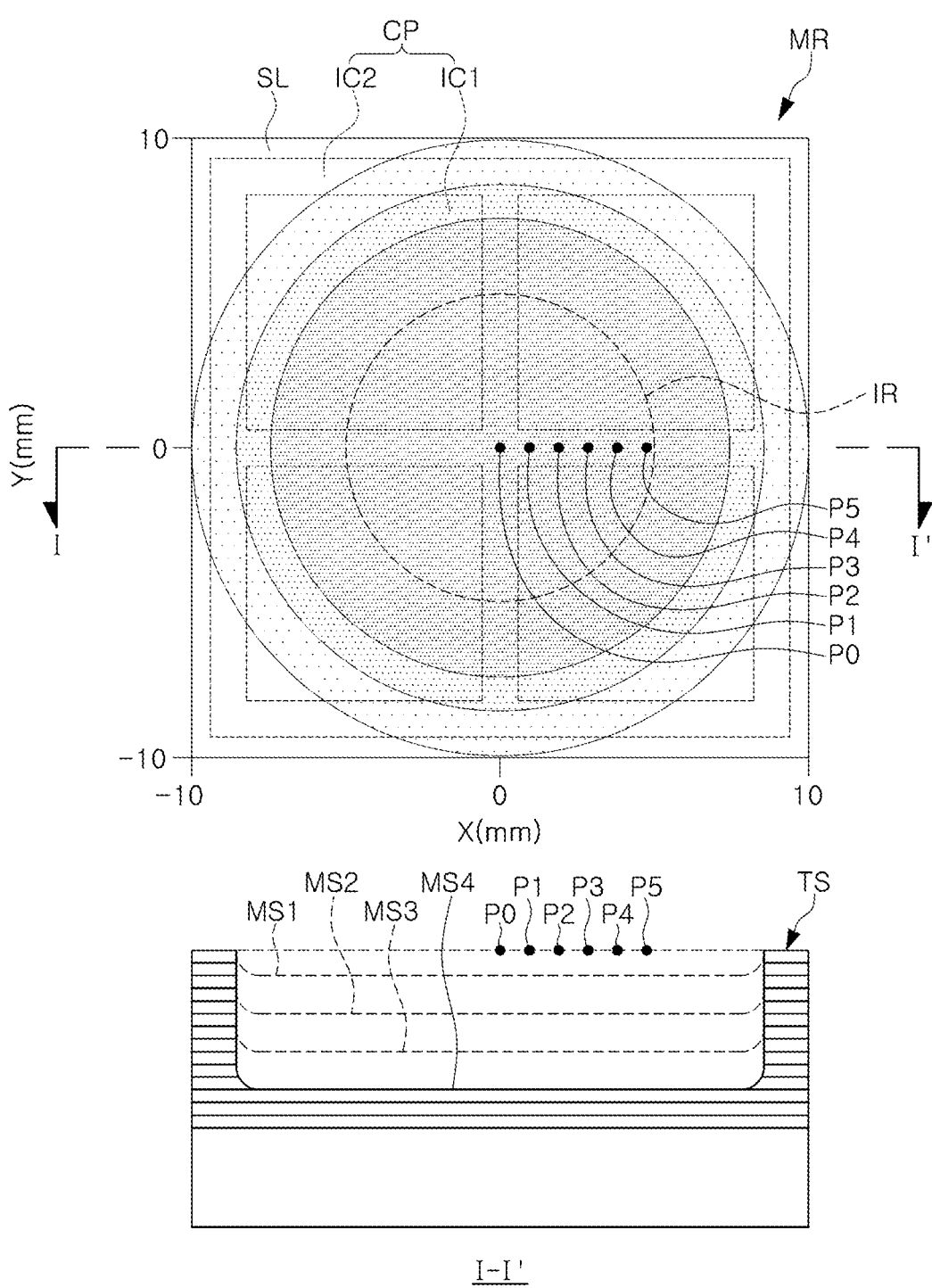
FIG. 6A is a diagram illustrating milling surfaces formed in a milling region to which the cumulative dosage map of FIG. 5A is applied.
Figure 6B:
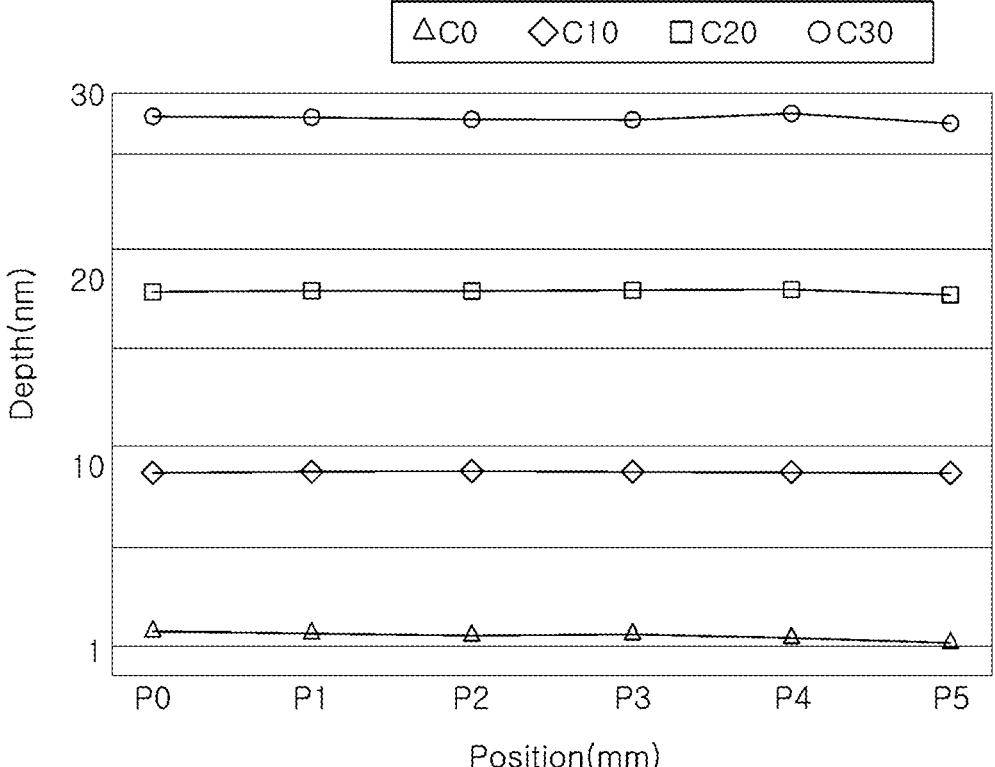
FIG. 6B is a graph illustrating milling depths of milling surfaces in P0, P1, P2, P3, P4, and P5 of FIG. 6A.

FIG. 6A is a diagram illustrating milling surfaces MS1, MS2, MS3, and MS4 formed in the milling region MR to which the cumulative dosage map DM1 of FIG. 5A is applied, and FIG. 6B is a graph illustrating milling depths C0, C10, C20, and C30 of milling surfaces MS1, MS2, MS3, and MS4 in P0, P1, P2, P3, P4, and P5 of FIG. 6A.

Referring to FIG. 6A, the milling region MR of the substrate 10 may include at least a portion of a chip region CP and a scribe line SL. For example, the milling region MR may include at least a portion of each of a core circuit IC1 and a peripheral circuit IC2. The first to fourth milling surfaces MS1, MS2, MS3, and MS4 may be formed on the substrate 10 in stages by a milling process to which the cumulative dosage map DM1 of FIG. 5A is applied. The second to fourth milling surfaces MS2, MS3, and MS4 may be formed by repeating a milling process for forming the first milling surface MS1 having a depth of about 1 mm to about 3 mm 10 times, 20 times, and 30 times, respectively. The milling depth of the first to fourth milling surfaces MS1, MS2, MS3, and MS4 may be defined as a depth from an uppermost surface TS of the substrate 10 to a lowermost surface of the first to fourth milling surfaces MS1, MS2, MS3, and MS4. The measurement locations P0, P1, P2, P3, P4, and P5 illustrated in the figure may be spaced apart from the center to the edge of the analysis region IR at a predetermined interval (e.g., about 1 mm). The analysis region IR may be a portion of regions of the first to fourth milling surfaces MS1, MS2, MS3, and MS4, parallel to the upper surface TS of the substrate 10.

Referring to FIG. 6B together, the first milling depth C0, the second milling depth C10, the third milling depth C20, and the fourth milling depth C30 may have excellent uniformity. For example, a difference between the highest point and the lowest point (hereinafter, referred to as 'surface uniformity') of the first to fourth milling surfaces MS1, MS2, MS3, and MS4 may be about 2% or less. In particular, according to an example embodiment, the first to fourth milling depths C0, C10, C20, and C30 may be formed to have the same level of depth as that of the first to third positions P0, P1, and P2 even at the fourth position P3 and the fifth position P4, relatively adjacent to the edge of the analysis region IR.

Figure 7A:
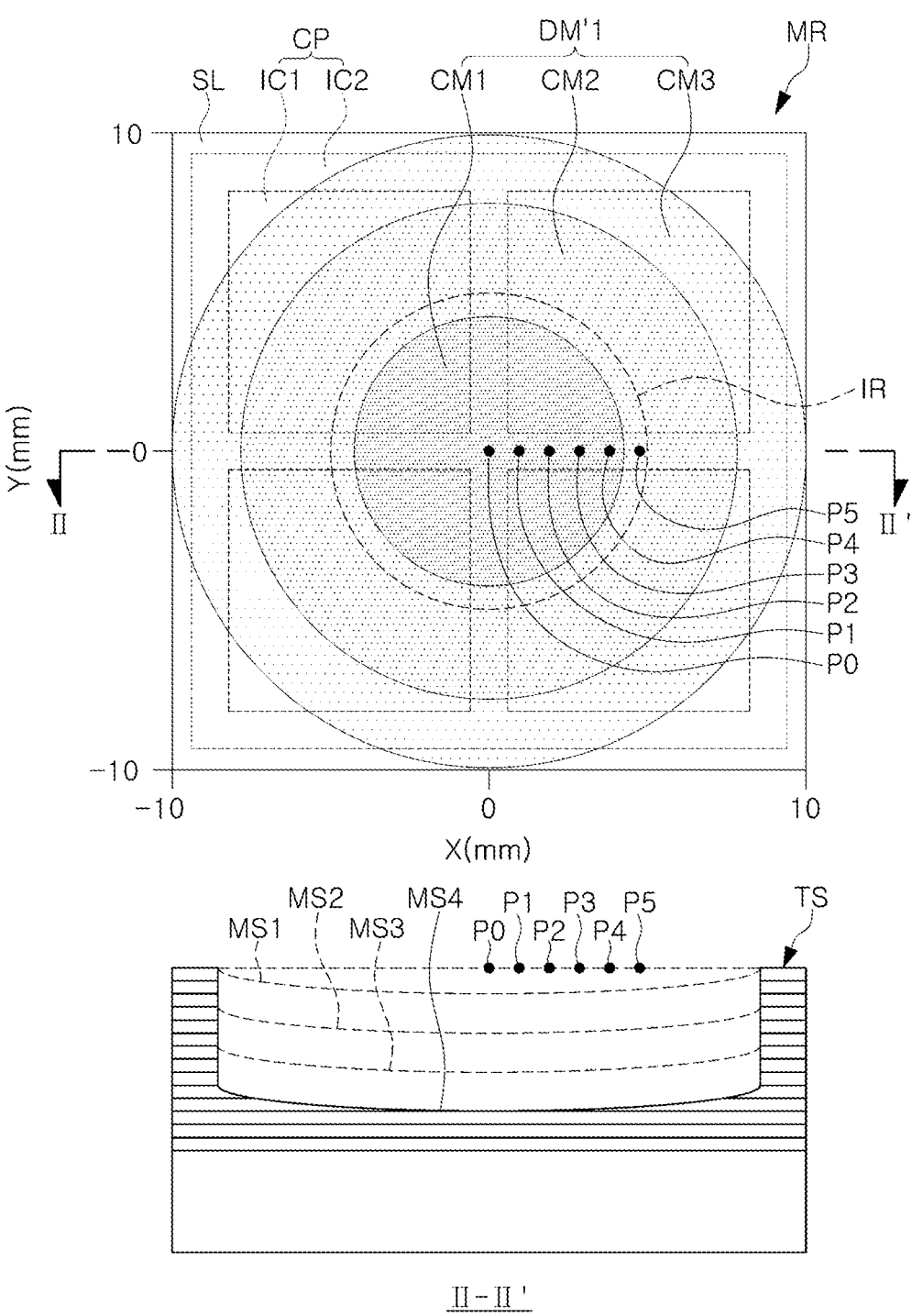
FIG. 7A is a diagram illustrating milling surfaces formed in a milling region to which the cumulative dosage map of FIG. 5B is applied.
Figure 7B:
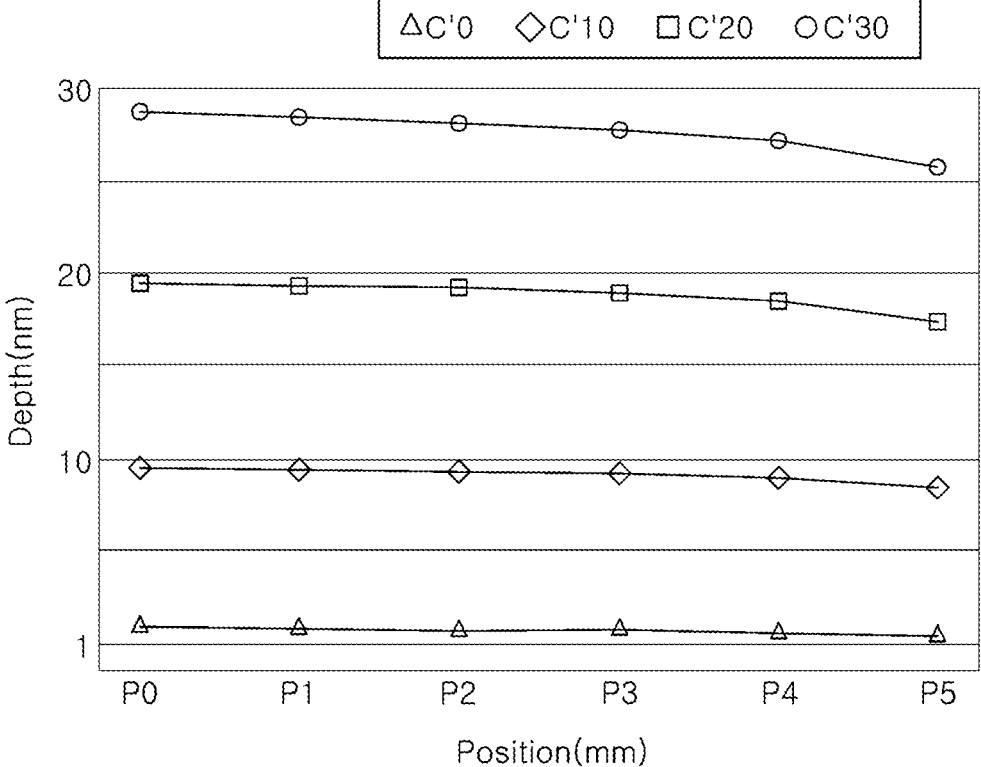
FIG. 7B is a graph illustrating milling depths of milling surfaces in P0, P1, P2, P3, P4, and P5 of FIG. 7A.

FIG. 7A is a diagram illustrating milling surfaces MS1, MS2, MS3, and MS4 formed in a milling region MR to which the cumulative dosage map DM'1 of FIG. 5B of Comparative Example 1 is applied, and FIG. 7B is a view illustrating milling depths of the milling surfaces MS1, MS2, MS3, and MS4 in P0, P1, P2, P3, P4, and P5 of FIG. 7A.

Referring to FIG. 7A, first to fourth milling surfaces MS1, MS2, MS3, and MS4 may be formed in stages on the substrate 10 by a milling process to which the cumulative dosage map DM'1 of FIG. 5B is applied. The second to fourth milling surfaces MS2, MS3, and MS4 may be formed by repeating a milling process of forming the first milling surface MS1 having a depth of about 1 nm to about 3 nm 10 times, 20 times, and 30 times, respectively. The milling depth of the first to fourth milling surfaces MS1, MS2, MS3, and MS4 may be defined as a depth from an uppermost surface TS of the substrate 10 to a lowermost surface of the first to fourth milling surfaces MS1, MS2, MS3, and MS4. The measurement locations P0, P1, P2, P3, P4, and P5 illustrated in the figure may be spaced apart from a center to an edge of the analysis region IR at a predetermined interval (e.g., about 1 mm). The analysis region IR may be a partial region of the first to fourth milling surfaces MS1, MS2, MS3, and MS4, parallel to the upper surface TS of the substrate 10.

Referring to FIG. 7B together, first to fourth milling depths C'0, C'10, C'20, and C'30 of Comparative Example 1 may become shallower, closer to the edge of the analysis region IR. For example, surface uniformity of the first to fourth milling surfaces MS1, MS2, MS3, and MS4 of the Comparative Example may be about 5% or more or about 10% or more. In particular, according to the Comparative Example 1, the first to fourth milling depths C'0, C'10, C'20, and C'30 of the Comparative Example may be formed to have a relatively shallower depth in the fourth and fifth positions P4 and P5, relatively adjacent to the edge of the analysis region IR than that in the first to third positions P0, P1 and P2. That is, according to the Comparative Example 1, it may be difficult to secure a large-area analysis region in a top-down manner.

Hereinafter, cumulative dosages according to the scanning profiles of Example 2 and third and fourth Comparative Examples will be described with reference to FIGS. 8A to 9C.

Figure 8A:
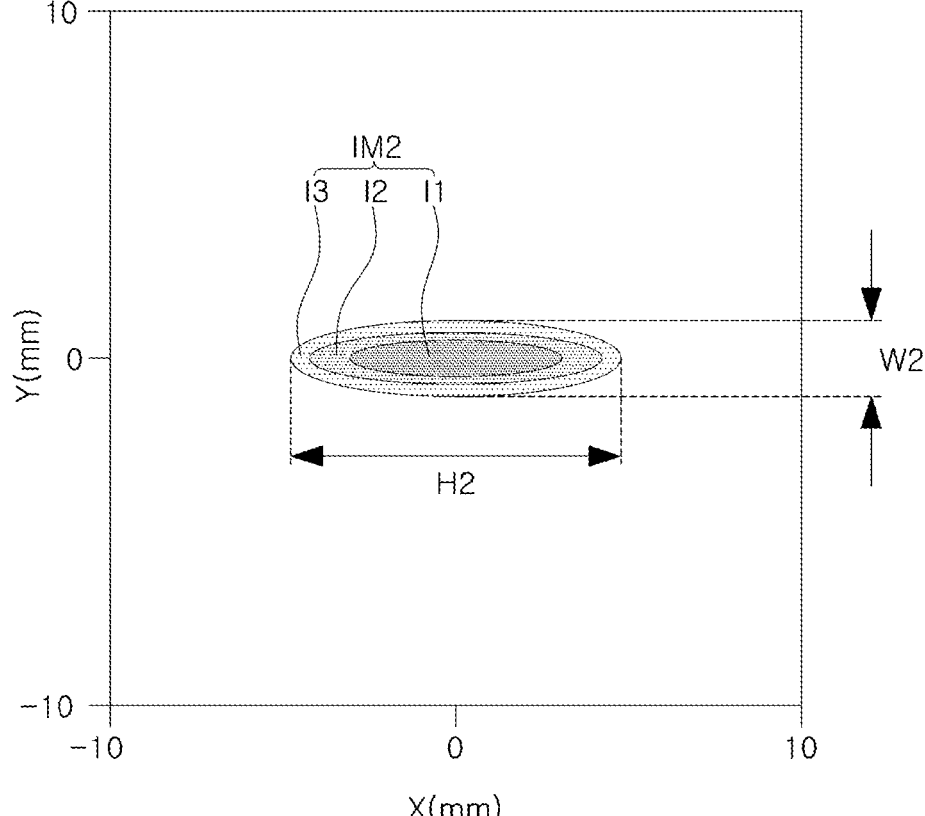
FIG. 8A is a diagram illustrating an intensity map of an ion beam within a predetermined milling region according to an example embodiment.

FIG. 8A is a diagram illustrating an intensity map IM2 of an ion beam according to Example 2 in a predetermined milling region.

Referring to FIG. 8A, the intensity map IM2 of Example 2 represents intensity of the ion beam IB incident at a predetermined incident angle θ1, e.g., about 87 degrees. An angle θ2 between a first axis A1 of the ion beam IB and an upper surface of the substrate 10 may be about 3 degrees. The intensity map IM2 of Example 2 may include a first region I1, a second region I2, and a third region I3 within a predetermined region (e.g., a milling region MR of 20 mm×20 mm). The first region I1, the second region I2, and the third region I3 may be understood as a region having intensity in a range corresponding to the first to third regions I1, I2, and I3 (see FIG. 4A) of Example 1, respectively. A boundary between the first region I1, the second region I2, and the third region I3 may not be clearly distinguished. The first region I1, the second region I2, and the third region I3 may represent a region sequentially having lower intensity, respectively. For convenience of explanation, the intensity map IM2 of the Example 2 is illustrated as three regions, but substantially, the intensity map IM2 of Example 2 may include three or more regions. The intensity map IM2 of the second embodiment may have a second aspect ratio (e.g., a ratio of a width W2 to a height H2). The second aspect ratio H2/W2 may be lower than the first aspect ratio H1/W2 of Example 1. For example, the intensity map IM2 of Example 2 may have a width W2 of about 2 mm and a height H2 of about 10 mm.

Figure 8B:
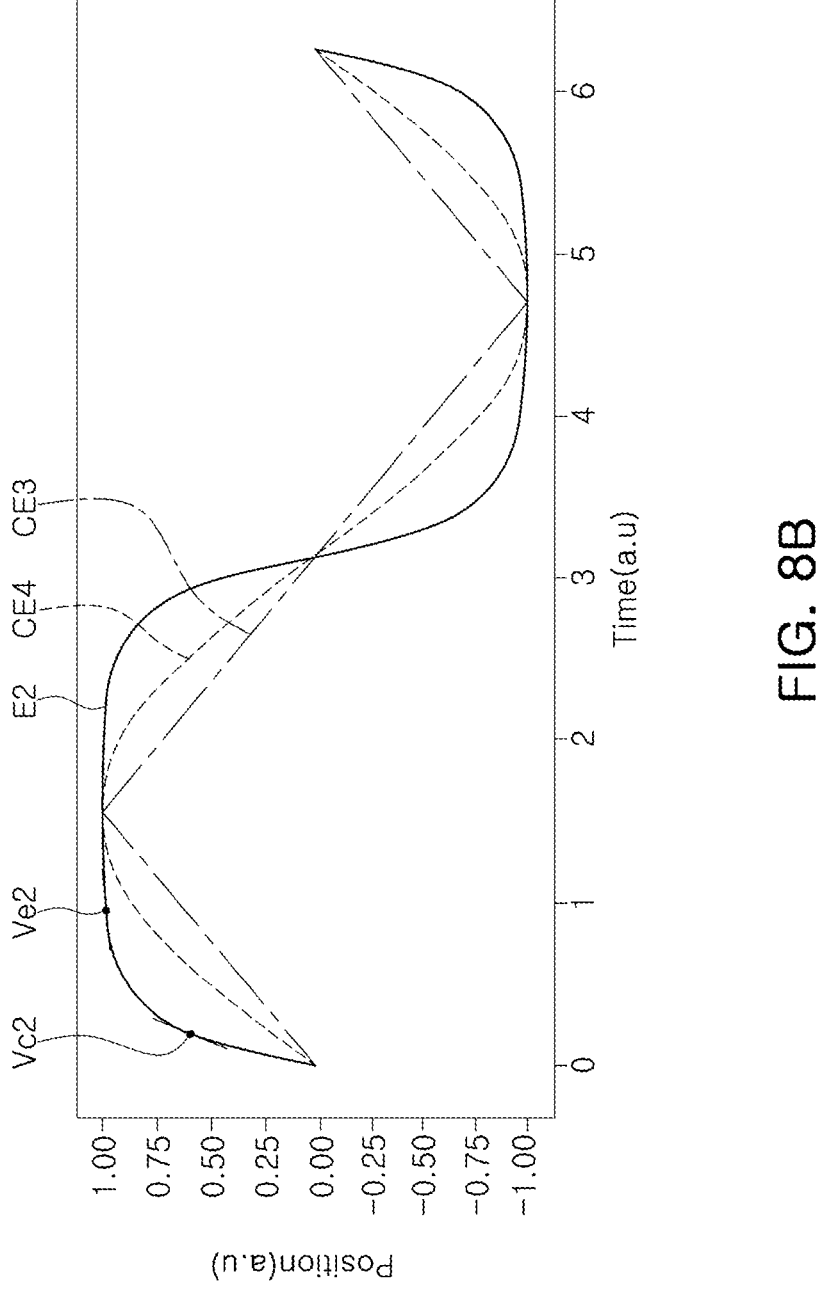
FIG. 8B is a graph illustrating scanning profiles according to Examples and Comparative Examples.

FIG. 8B is a graph illustrating scanning profiles E2, CE3, and CE4 according to Example 2 and Comparative Examples. The scanning profiles E2, CE3, and CE4 of FIG. 8B show a change in positions of the ion beam IB over time. Here, "time" and "position" may be defined as an arbitrary unit (a.u). For example, amplitudes of the scanning profiles E2, CE3, and CE4 may correspond to a scan range (e.g., ±10 mm) of the ion beam IB with respect to a center of the milling region.

Referring to FIG. 8B, a scanning profile E2 of the second embodiment may be configured so that a moving speed of the ion beam IB rapidly decreases closer to an edge (a position of ±1.00) of the milling region MR. For example, in the scanning profile E2 of the second embodiment, a moving speed Ve2 of the ion beam IB at a position of about +0.85 may be lower than a moving speed Ve2 of the ion beam IB at a position of about +0.50. In particular, the moving speed Ve2 of the second embodiment at the position of about +0.85 may be slower than the moving speed Ve1 of the first embodiment (see FIG. 4B) at the same position.

The scanning profile E2 of the second embodiment may be received based on an intensity map of the ion beam IB. That is, the scanning profile E2 of the second embodiment based on the intensity map IM2 of the second embodiment may be configured so that the moving speed Ve2 of the ion beam IB at the edge of the milling region MR is further reduced than the scanning profile E1 of the first embodiment based on the intensity map IM1 (having a relatively large aspect ratio) of the first embodiment.

The scanning profile E2 of Example 2 may be configured to adjust the moving speed of the ion beam IB based on the incident angle θ1 of the ion beam IB. That is, the scanning profile E2 of Example 2 may be configured so that a moving speed Ve2 of the ion beam IB at an edge of the milling region MR is further reduced than that of the scanning profile E1 of Example 1 at a relatively large incident angle θ1.

The scanning profile E2 of Example 2 may be configured so that the root mean square roughness Rq of the cumulative dosage value graph of the ion beam IB irradiated to the analysis region ('IR' in FIG. 9A) is minimized.

In the scanning profile CE3 of the Comparative Example 3, a moving speed of the ion beam IB may be constant throughout the milling region MR. In the scanning profile CE3 of the Comparative Example 3, a moving speed of the ion beam IB at a position of about +0.85 and a moving speed of the ion beam IB at a position of about +0.50 may be substantially the same.

The scanning profile CE4 of Example 4 may be configured so that the dose of the ion beam at an edge of the milling region MR is reduced relative to that of the scanning profile E2 of Example 2. At the edge of the milling region MR, a moving speed of the ion beam IB according to the scanning profile CE4 of the Comparative Example 4 may be faster than the moving speed of the ion beam IB according to the scanning profile E2 of Example 2. For example, the moving speed of the ion beam IB according to the scanning profile CE4 of the Comparative Example 4 at a position of about +0.85 may be faster than the moving speed Ve2 of the ion beam IB according to the scanning profile E2 of Example 2.

Figure 9A:
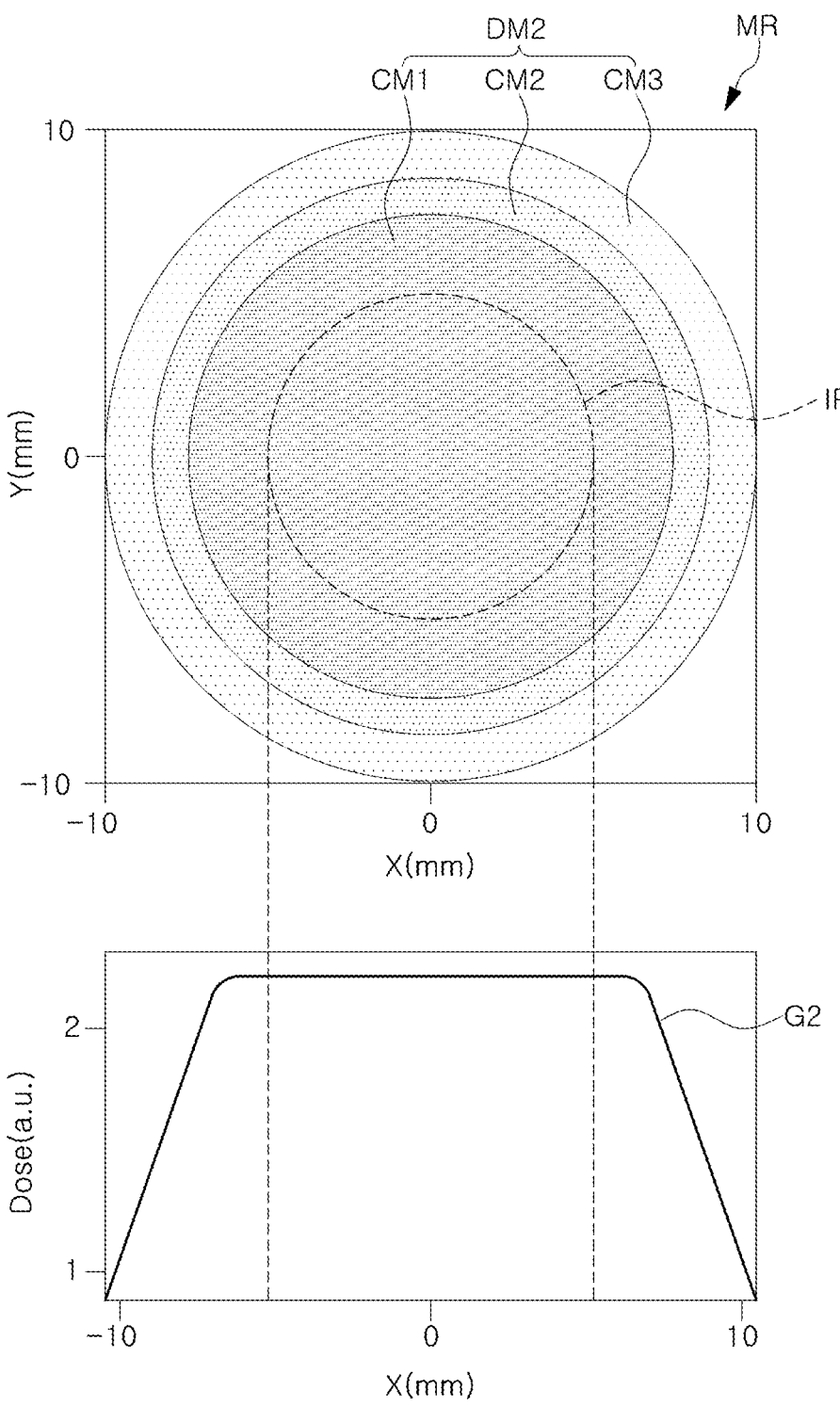
FIG. 9A is a cumulative dosage map and graph illustrating a dosage amount of an ion beam accumulated in a predetermined milling region when the ion beam of FIG. 8A is scanned according to a scanning profile of Example 2.

FIG. 9A is a cumulative dosage map DM2 and a dosage value graph G2 illustrating a dosage amount of the ion beam accumulated in a predetermined milling region MR, when the ion beam of FIG. 8A is scanned according to the scanning profile E2 of Example 2.

Referring to FIG. 9A, the cumulative dosage map DM2 of Example 2 may illustrate a dosage amount of the ion beam IB accumulated in the milling region MR according to the scanning profile E2 of Example 2 while the substrate 10 is rotated about the milling region MR. The dosage map DM2 of the Example 2 may include a first cumulative region CM1, a second cumulative region CM2, and a third cumulative region CM3. It can be understood that the first to third cumulative regions CM1, CM2, and CM3 of Example 2 are regions having an accumulated dosage amount in the same range as the first to third cumulative regions CM1, CM2, and CM3 of Example 1 (see FIG. 5A). According to the intensity map IM2 of Example 2 and the scanning profile E2 of Example 2, the first cumulative region CM1 having a diameter of about 10 mm or more may be formed. As a result, by uniformly controlling a milling depth of the substrate 10 by the ion beam IB within the analysis region IR, a large-area analysis region IR having excellent uniformity may be formed within the milling region MR.

The cumulative dosage value graph G2 of Example 2 may illustrate the accumulated dosage amount of the ion beam IB with respect to an axis passing through a center of the milling region MR in an X direction. The scanning profile E2 of Example 2 may be configured so that root mean square roughness Rq of the cumulative dosage value graph G2 is minimized. Within the analysis region IR, the root mean square roughness Rq of the cumulative dosage value graph G2 of Example 2 may be about 0.01 or less. The analysis region IR may have a diameter of D1 of about 8 mm or more. The analysis region IR is set to a central portion of the first cumulative region CM1 spaced at an arbitrary distance from the boundary between the first cumulative region CM1 and the second cumulative region CM2.

Figure 9B:
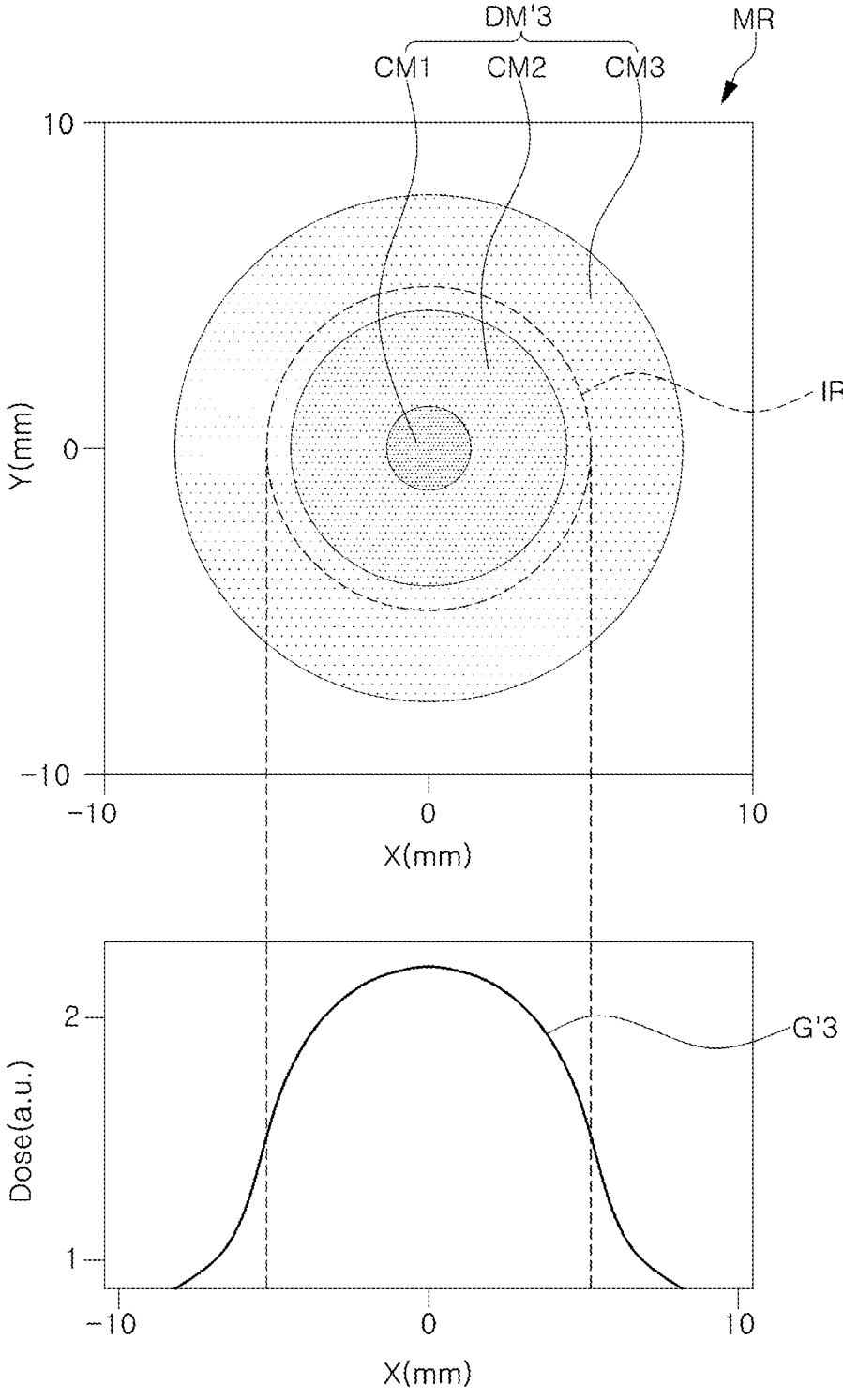
FIG. 9B is a cumulative dosage map and graph illustrating a dosage amount of the ion beam accumulated in a predetermined milling region when the ion beam of FIG. 8A is scanned according to a scanning profile of Comparative Example 3.

FIG. 9B is a cumulative dosage map DM'3 and a dosage value graph G'3 illustrating a dosage amount of the ion beam accumulated in a predetermined milling region MR, when the ion beam of FIG. 8A is scanned according to a scanning profile CE3 of the Comparative Example 3.

Referring to FIG. 9B, the cumulative dosage map DM'3 of the Comparative Example 3 may illustrate a dosage amount of the ion beam IB accumulated in the milling region MR according to the scanning profile CE3 of the Comparative Example 3, while the substrate 10 is rotated around the milling region MR. In the dosage map DM'3 of the Comparative Example 3, it can be understood that each of the first cumulative region CM1, the second cumulative region CM2, and the third cumulative region CM3 is a region having an accumulated dosage amount in a range corresponding to the first cumulative region CM1, the second cumulative region CM2, and the third cumulative region CM3 of Example 2, respectively (e.g., sizes, rather than dosages, of the regions may be different). The first cumulative region CM1 of the Comparative Example 3 may be formed to have a smaller area than the first cumulative region CM1 of Example 2. For example, the first and second cumulative regions CM1 and CM2 of Comparative Example 3 may be formed to have smaller areas than the analysis region IR set in Example 2. In addition, within the analysis region IR, the root mean square roughness Rq of the cumulative dosage value graph G'3 of Comparative Example 3 may be about 0.01 or more (e.g., about 0.09 or more). Therefore, according to Comparative Example 3, it may be difficult to form a large-area analysis region IR having excellent surface uniformity.

Figure 9C:
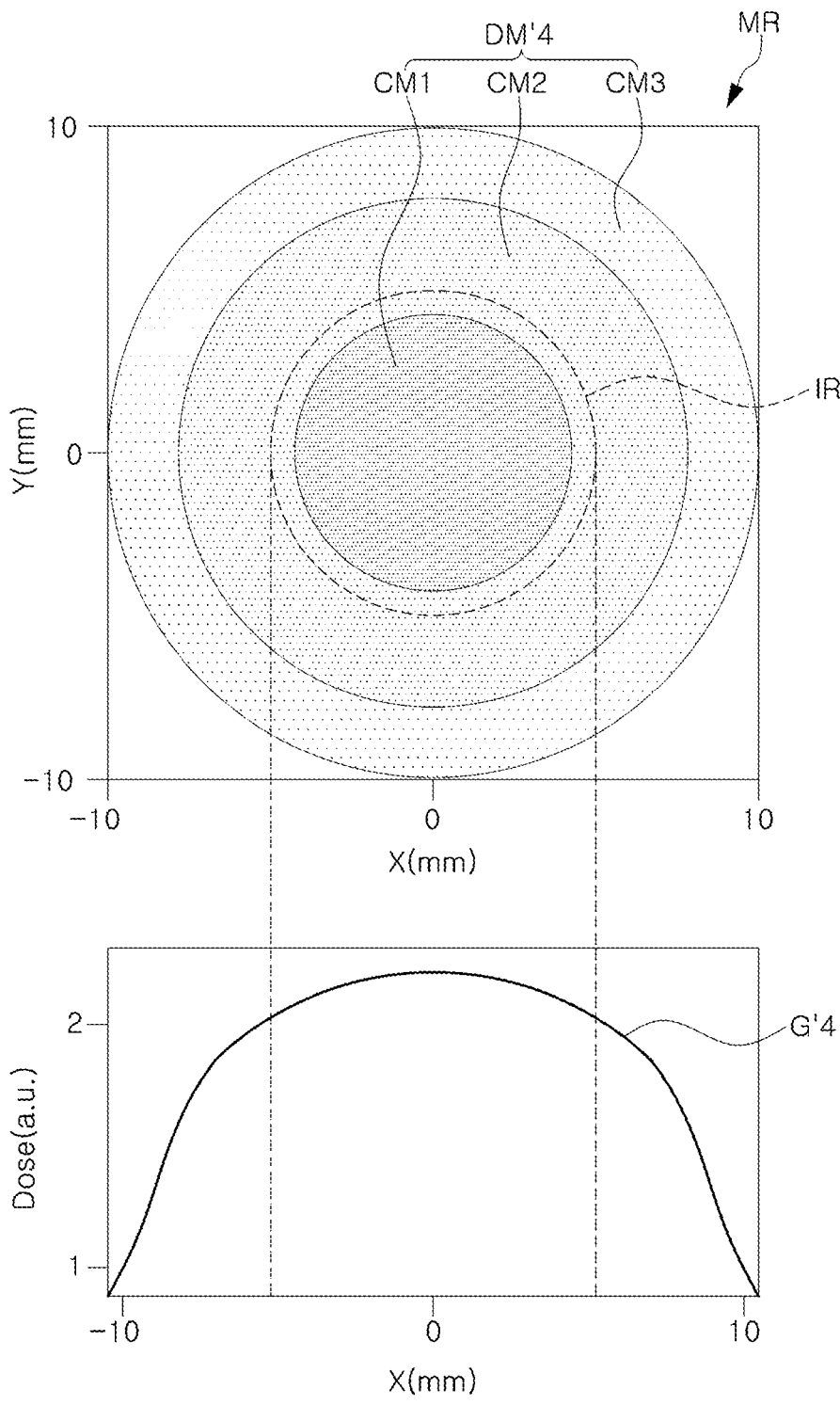
FIG. 9C is a cumulative dosage map and graph illustrating a dosage amount of an ion beam accumulated in a predetermined milling region when the ion beam of FIG. 8A is scanned according to a scanning profile of Comparative Example 4.

FIG. 9C is a cumulative dosage map DM'4 and a dosage value graph G'4 illustrating a dosage amount of the ion beam accumulated in a predetermined milling region MR, when the ion beam of FIG. 8A is scanned according to a scanning profile CE4 of the Comparative Example 4.

Referring to FIG. 9C, the cumulative dosage map DM'4 of the Comparative Example 4 may illustrate a dosage amount of the ion beam IB accumulated in the milling region MR according to the scanning profile CE4 of the Comparative Example 4, while the substrate 10 is rotated around the milling region MR. In the dosage map DM'4 of the Comparative Example 4, it can be understood that each of the first cumulative region CM1, the second cumulative region CM2, and the third cumulative region CM3 is a region having a cumulative dosage amount in a range corresponding to the first cumulative region CM1, the second cumulative region CM2 and the third cumulative region CM3 of Example 2, respectively (e.g., sizes, rather than dosages, of the regions may be different). The first cumulative region CM1 of the Comparative Example 4 may be formed to have a smaller area than the first cumulative region CM1 of Example 2. For example, the first cumulative region CM1 of the Comparative Example 4 may be formed to have a smaller area than that of the analysis region IR set in Example 2. In addition, within the analysis region IR, the root mean square roughness Rq of the cumulative dosage value graph G'4 of Comparative Example 4 may be about 0.01 or more (e.g., about 0.05 or more). Therefore, according to Comparative Example 4, it may be difficult to form a large-area analysis region IR having excellent surface uniformity.

Figure 10A:
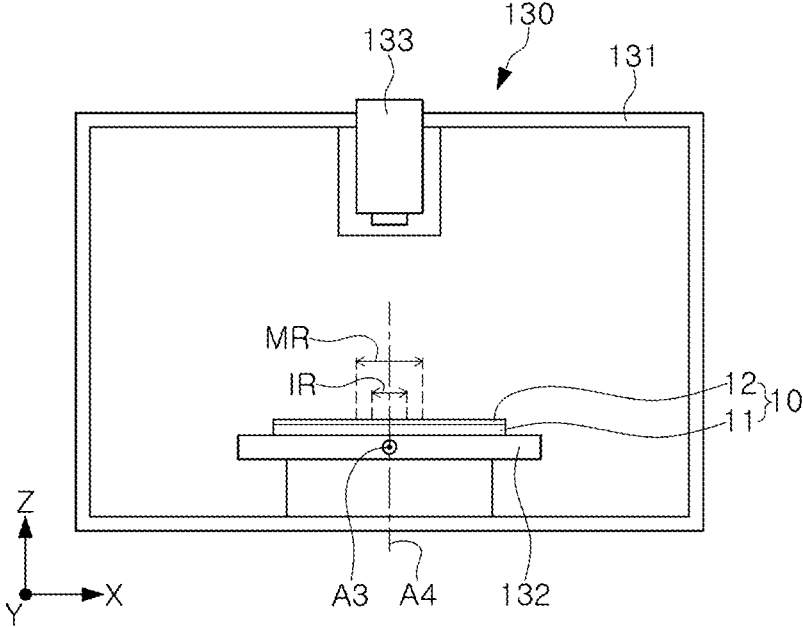
FIG. 10A is a diagram schematically illustrating a depth measuring module applicable to a substrate analysis system according to an example embodiment.
Figure 10B:
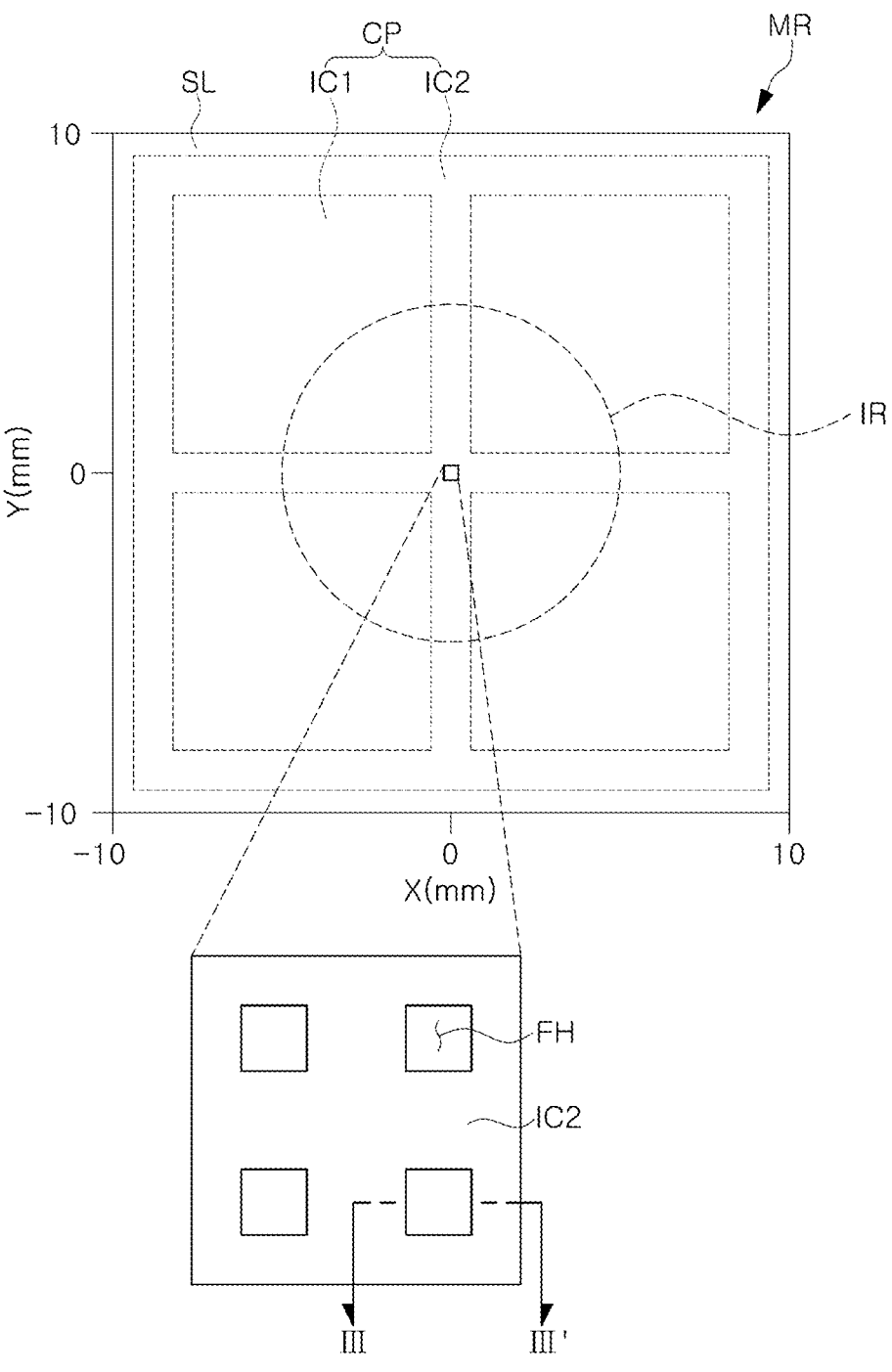
FIG. 10B is a plan view illustrating a portion of a milling region in which a fiducial hole is formed.
Figure 10C:
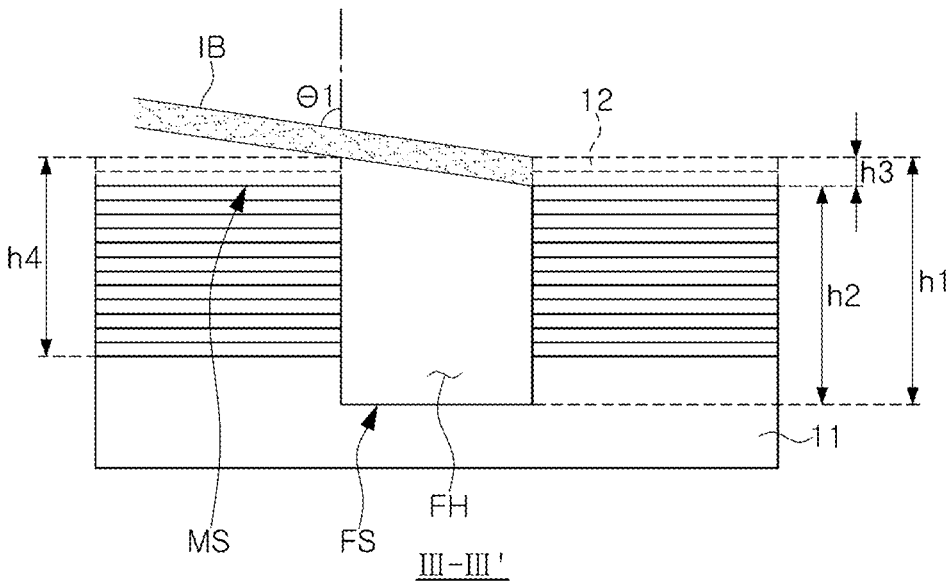
FIG. 10C is a diagram illustrating a principle of measuring a milling depth using a fiducial hole.
Figure 11:
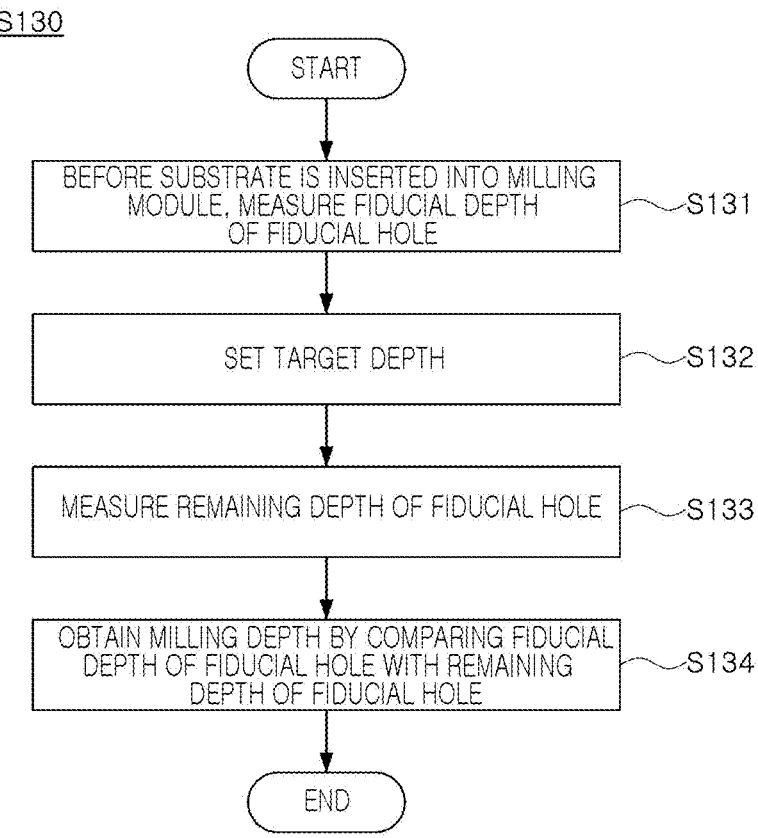
FIG. 11 is a flowchart schematically illustrating a process of measuring a milling depth according to the depth measuring module of FIG. 10A.

FIG. 10A is a diagram schematically illustrating a depth measuring module 130 applicable to the substrate analysis system 100 according to an example embodiment, FIG. 10B is a plan view illustrating a portion of a milling region MR in which a fiducial hole FH is formed, and FIG. 10C is a cross-section along line III-III' of FIG. 10B illustrating a principle of measuring a milling depth h3 using the fiducial hole FH. FIG. 11 is a flowchart schematically illustrating a measuring process (S130) for forming a milling depth h3 according to the depth measuring module 130 of FIG. 10A.

Referring to FIGS. 10A to 11, the depth measuring module 130 (e.g., depth measurer) of an example embodiment may be configured to receive the substrate 10 from the milling module 120, and measure a milling depth of the analysis region IR. The depth measuring module 130 may include a chamber 131 (e.g., a second chamber), a stage 132 (e.g., a second stage), and a depth measuring unit 133 (e.g., a measurer).

As illustrated in FIG. 11, the depth measuring process (S130) of an example embodiment may include setting a target depth h4 (S132), measuring a remaining depth h2 of a fiducial hole FH (S133), and obtaining a milling depth h3 using the remaining depth h2 of the fiducial hole FH (S134). According to the example embodiment, before the substrate 10 is inserted into the milling module 120, measuring the fiducial depth h1 of the fiducial hole FH (S131) may be performed.

As illustrated in FIG. 10B, the substrate 10 may include at least one fiducial hole FH formed in the analysis region IR. At least one fiducial hole FH may be formed around a region to be measured for milling depth. For example, as illustrated in FIG. 10B, four fiducial holes FH may be formed to measure a milling depth of a central portion of the analysis region IR, e.g., the four fiducial holes FH may surround a target (e.g., milling) region of the analysis region IR. The fiducial hole FH may be formed to pass, e.g., penetrate, through the pattern layer 12. For example, the fiducial hole FH may expose a portion of the base layer 11. For example, any suitable size and shape of the fiducial hole FH may be used. For example, the fiducial hole FH may be formed in a square shape having a size of 20 μm×20 μm. Depending on the example embodiment, the fiducial hole FH may be formed in a trench shape.

The chamber 131 may have an inner space, independent from the outside. Elements such as the stage 132, the depth measuring unit 133, and the like, may be disposed in the inner space of the chamber 131. Depending on the example embodiment, some elements may be disposed outside the chamber 131. The inner space of the chamber 131 may be in a low-pressure state, e.g., about 5 Pa or less or in a vacuum state.

The stage 132 may be disposed in a lower portion of the chamber 131. The stage 132 may be configured to temporarily fix the substrate 10 seated on an upper surface thereof. The stage 132 may be configured to move the substrate 10 in horizontal directions (X and Y directions) to align the depth measuring unit 133 and the substrate 10. In addition, the stage 132 may be configured to rotate about a third axis A3 and/or a fourth axis A4.

The depth measuring unit 133 may be disposed in an upper portion of the chamber 131, e.g., above the stage 132. The depth measuring unit 133 may be configured to optically measure a remaining depth h2 of the fiducial hole FH. For example, referring to FIG. 10A, the depth measuring unit 133 may be configured to, e.g., directly, measure the remaining depth h2 from a bottom surface FS of the fiducial hole FH to the milling surface MS. The depth measuring unit 133 may include a white light scanning interferometry (WLSI). As illustrated in FIG. 10C, when an ion beam IB is irradiated onto the pattern layer 12 at a predetermined incident angle θ1, the ion beam IB does not reach a bottom surface FS of the fiducial hole FH, and may be selectively provided on a sidewall of the fiducial hole FH. For example, the fiducial hole FH may have a fiducial depth h1, a remaining depth h2, and a milling depth h3. The fiducial depth h1 may be a depth of the fiducial hole FH before milling the substrate 10. The remaining depth h2 may be a depth of the fiducial hole FH after milling the substrate 10. The milling depth h3 may be a depth from which the pattern layer 12 is removed after the milling process. For example, the milling depth h3 may correspond to a difference between the remaining depth h2 and the fiducial depth h1. Meanwhile, the target depth h4 may be a value arbitrarily set to end a milling process, or the like. The target depth h4 may be shallower than or equal to the fiducial depth h1. For example, the target depth h4 may correspond to the thickness of the pattern layer 12.

Figure 12:
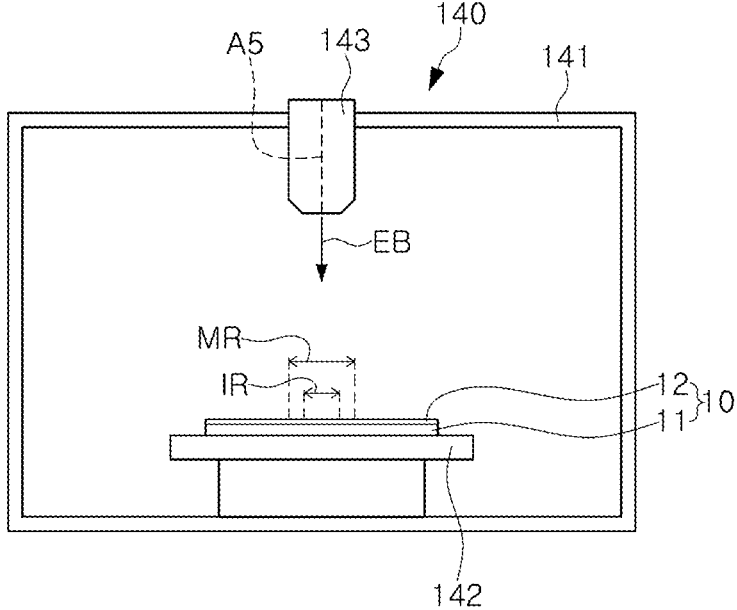
FIG. 12 is a diagram schematically illustrating an imaging module applicable to a substrate analysis system according to an example embodiment.

FIG. 12 is a diagram schematically illustrating an imaging module 140 applicable to the substrate analysis system 100 according to an example embodiment.

Referring to FIG. 12, the imaging module 140 (e.g., an imager) according to an example embodiment may be configured to receive the substrate 10 from the depth measuring module 130, and capture a 2D image of an analysis region IR. For example, the imaging module 140 may include a chamber 141 (e.g., a third chamber), a stage 142 (e.g., a third stage), and an image capturing unit 143 (e.g., an image capturer).

The chamber 141 may have an inner space, independent from the outside. Elements such as the stage 142, the image capturing unit 143, and the like, may be disposed in the inner space of the chamber 141. Depending on the example embodiment, some elements may be disposed outside the chamber 141. The inner space of the chamber 141 may be in a low-pressure state, e.g., about 5 Pa or less or in a vacuum state.

The stage 142 may be disposed in a lower portion the chamber 141. The stage 142 may be configured to temporarily fix the substrate 10 seated on an upper surface thereof. The stage 142 may be configured to move the substrate 10 in horizontal directions (X and Y directions), in order to align the image capturing unit 143 and the substrate 10. For example, the stage 142 may be moved in the horizontal directions (X and Y directions) so that a fifth axis A5 of the image capturing unit 143 is perpendicular to an upper surface of the substrate 10 or an upper surface of the analysis region IR.

The image capturing unit 143 may be disposed in an upper portion of the chamber 141 (e.g., above the stage 142) to easily capture a planar image of the analysis region IR. The image capturing unit 143 may be configured to capture a planar image by irradiating analysis region IR with an electron beam EB. For example, the image capturing unit 143 may include a scanning electron microscope (SEM). Since the image capturing unit 143 is disposed in the chamber 141 of the imaging module 140, independent from the milling module 120 (e.g., the imaging module 140 and the milling module 120 are physically separated and positioned in different spaces), performance degradation of the image capturing unit 143 due to milling by-products or the like (e.g., contamination of the SEM column) may be prevented, and high-resolution images may be captured (e.g., structurally possible to take and optimize top-view images by SEM). In addition, since the image capturing unit 143 captures a milling surface or an analysis region IR, parallel to the upper surface of the substrate 10, images may be provided without a separate correction process.

By way of summation and review, embodiments provide a substrate analysis system capable of three-dimensionally analyzing a substrate. That is, according to example embodiments, a substrate analysis system capable of three-dimensionally analyzing a substrate may be provided by forming a uniform large-area analysis region within a milling region. The uniform large-area analysis region may be formed by setting, e.g., adjusting or controlling, a scanning profile according to an intensity map of an ion beam, e.g., to control and increase the amount of milling according to a distance from the milling area, and the scanning profile may be configured so that a dose of the ion beam increases at an edge of the milling area.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate analysis system, comprising:
a load-lock configured to load or unload a substrate with a pattern layer;
a miller configured to irradiate an ion beam toward a milling region of the pattern layer, the ion beam to irradiate a milling surface from which at least a portion of the pattern layer is removed;
a depth measurer configured to receive the substrate from the miller and to measure a milling depth of an analysis region in a central portion of the milling surface;
an imager configured to receive the substrate from the depth measurer and to capture a plurality of two-dimensional images of the analysis region;
a substrate transferer configured to transfer the substrate between the load-lock, the miller, the depth measurer, and the imager; and a controller configured to control the substrate transferer so that the substrate circulates through the miller, the depth measurer, and the imager, when the milling depth obtained from the depth measurer is shallower than a set target depth,
wherein the miller is configured to adjust a path of the ion beam so that the ion beam moves horizontally within the milling region according to a scanning profile received based on an intensity map of the ion beam.

2. The substrate analysis system as claimed in claim 1, wherein a moving speed of the ion beam according to the scanning profile decreases toward an edge of the milling region.

3. The substrate analysis system as claimed in claim 2, wherein the moving speed of the ion beam at the edge of the milling region decreases as an aspect ratio of the intensity map decreases.

4. The substrate analysis system as claimed in claim 1, wherein the scanning profile is configured such that a root mean square roughness (Rq) of a graph of a cumulative dosage value of the ion beam irradiated to the analysis region is minimized.

5. The substrate analysis system as claimed in claim 4, wherein the root mean square roughness (Rq) of the graph of the cumulative dosage value is about 0.01 or less.

6. The substrate analysis system as claimed in claim 1, wherein the miller includes a stage on which the substrate is seated, and an ion mill configured to irradiate the substrate with the ion beam.

7. The substrate analysis system as claimed in claim 6, wherein the ion mill includes:
an ion beam generator configured to generate the ion beam;
an ion beam collimator configured to focus the ion beam generated by the ion beam generator; and
an ion beam deflector configured to deflect a path of the ion beam focused by the ion beam collimator.

8. The substrate analysis system as claimed in claim 6, wherein, when the ion beam is irradiated to the milling region, the stage is configured to rotate the substrate in an azimuthal direction with the milling region at a center.

9. The substrate analysis system as claimed in claim 1, wherein the miller is configured to mill the pattern layer so that the analysis region is parallel to an upper surface of the substrate.

10. The substrate analysis system as claimed in claim 1, wherein the substrate includes at least one fiducial hole penetrating through the pattern layer in the milling region, and
wherein the depth measurer is configured to obtain the milling depth by measuring a remaining depth of the at least one fiducial hole of the substrate received from the miller.

11. The substrate analysis system as claimed in claim 10, wherein the depth measurer includes a measurer configured to measure the remaining depth from a bottom surface of the at least one fiducial hole to the milling surface.

12. The substrate analysis system as claimed in claim 11, wherein the measurer includes a white light scanning interferometer.

13. The substrate analysis system as claimed in claim 1, wherein, when the milling depth is equal to or greater than the set target depth, the controller is configured to obtain a three-dimensional image of the analysis region using the plurality of two-dimensional images from the imager.

14. A substrate analysis system, comprising:

a miller including a stage, on which a substrate with a pattern layer is positioned, and an ion mill, the ion mill configured to irradiate an ion beam toward a milling region of the pattern layer, the ion beam to irradiate a milling surface from which at least a portion of the pattern layer is removed, and adjust a path of the ion beam according to a scanning profile of the ion beam;

a depth measurer configured to receive the substrate from the miller, the depth measurer including a measurer configured to measure a milling depth of an analysis region within the milling surface;

an imager configured to receive the substrate from the depth measurer, the imager including an image capturer configured to capture a two-dimensional image of the analysis region;

a substrate transferer configured to transfer the substrate between the miller, the depth measurer, and the imager; and wherein the miller is configured to adjust a-the path of the ion beam so that the ion beam moves horizontally within the milling region according to the scanning profile received based on an intensity map of the ion beam, and wherein a moving speed of the ion beam according to the scanning profile decreases toward an edge of the milling region.

15. The substrate analysis system as claimed in claim 14, wherein the analysis region is a partial region of the milling surface and is parallel to an upper surface of the substrate.

16. The substrate analysis system as claimed in claim 14, wherein the analysis region is a partial region of the milling surface having a surface uniformity of about 2% or less.

17. A substrate analysis system, comprising:

a miller including a stage, on which a substrate with a pattern layer is positioned, and an ion mill, the ion mill configured to irradiate an ion beam toward a milling region of the pattern layer, the ion beam to irradiate a milling surface from which at least a portion of the pattern layer is removed, and adjust a path of the ion beam so that the ion beam moves horizontally within the milling region according to a scanning profile of the ion beam;

a depth measurer configured to receive the substrate from the miller and to measure a milling depth of an analysis region in a central portion of the milling surface;

an imager configured to receive the substrate from the depth measurer and to capture a plurality of two-dimensional images of the analysis region; and a substrate transferer configured to transfer the substrate between the miller, the depth measurer, and the imager.

18. The substrate analysis system as claimed in claim 17, wherein the scanning profile is configured so that the ion beam having a relatively small incident angle has a relatively slow moving speed at an edge of the milling region.

19. The substrate analysis system as claimed in claim 17, wherein the stage is configured to rotate the substrate around the milling region, when the ion beam is irradiated toward the milling region.

20. The substrate analysis system as claimed in claim 17, wherein the ion mill includes a focused ion beam.

\*    \*    \*    \*    \*